US008480942B2

(12) United States Patent
Shannon et al.

(10) Patent No.: US 8,480,942 B2
(45) Date of Patent: Jul. 9, 2013

(54) METHOD OF FORMING A PATTERNED LAYER OF A MATERIAL ON A SUBSTRATE

(75) Inventors: Mark A Shannon, Champaign, IL (US); Junghoon Yeom, Savoy, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 239 days.

(21) Appl. No.: 13/015,299

(22) Filed: Jan. 27, 2011

(65) Prior Publication Data

US 2011/0210468 A1    Sep. 1, 2011

Related U.S. Application Data

(60) Provisional application No. 61/298,757, filed on Jan. 27, 2010.

(51) Int. Cl.
*B32B 38/10* (2006.01)

(52) U.S. Cl.
USPC ........... 264/293; 264/139; 264/482; 156/234; 156/235

(58) Field of Classification Search
USPC ................... 264/139, 293, 482; 156/234, 235
See application file for complete search history.

(56) References Cited

U.S. PATENT DOCUMENTS

| | | | | |
|---|---|---|---|---|
| 4,041,204 A * | 8/1977 | Hepher et al. | ................. | 430/253 |
| 4,374,691 A * | 2/1983 | Vanden Bergh | ............... | 156/234 |
| 4,454,179 A * | 6/1984 | Bennett et al. | ............... | 428/40.8 |
| 4,655,868 A * | 4/1987 | Hefele | ........................... | 156/238 |
| 5,148,193 A * | 9/1992 | Inamoto et al. | .................. | 347/45 |
| 5,376,204 A * | 12/1994 | Amano | .......................... | 156/234 |
| 5,484,644 A * | 1/1996 | Imamura et al. | ............ | 428/32.39 |
| 5,876,836 A * | 3/1999 | Imamura et al. | ............ | 428/32.39 |
| 5,895,541 A * | 4/1999 | Kobayashi et al. | ............ | 156/240 |
| 7,067,028 B2 * | 6/2006 | Aono | ............................. | 156/234 |
| 2006/0283540 A1 * | 12/2006 | Kronzer | ........................ | 156/235 |
| 2009/0250522 A1 * | 10/2009 | Williams et al. | .............. | 235/492 |

OTHER PUBLICATIONS

Ahn, Jong-Hyun et al., "*Heterogeneous Three-Dimensional Electronics by Use of Printed Semiconductor Nanomaterials*," Science 314, (2006) pp. 1754-1757.

Andersson, A-S et al., "*Patterning Colloidal Monolayer Films Using Microcontact Particle Stripping*," Nanotechnology 18, (2007) 5 pp.

Bao et al., "*A Novel Micromachining Technology for Multilevel Structures of Silicon*," Sensors and Actuators A 63, (1997) pp. 217-221.

(Continued)

*Primary Examiner* — Jeffrey Wollschlager
*Assistant Examiner* — Saeed Huda
(74) *Attorney, Agent, or Firm* — Brinks Hofer Gilson & Lione

(57) ABSTRACT

A method of forming a patterned layer of a material on a substrate includes forming a layer of the material on a stamp, and contacting the stamp with a first substrate comprising a pattern of protruding and recessed features to bring a first portion of the layer into conformal contact with the protruding features. The stamp is then removed from the first substrate. The first portion of the layer remains in conformal contact with the protruding features, and a second portion of the layer opposite the recessed features is removed with the stamp. Accordingly, a patterned layer is formed on the stamp inverse to the pattern on the first substrate. The method may further include transferring the patterned layer on the stamp to a second substrate.

31 Claims, 15 Drawing Sheets

OTHER PUBLICATIONS

Bassik, Noy et al., "*Patterning Thin Film Mechanical Properties to Drive Assembly of Complex 3D Structures*," Adv. Mater., 20, (2008) pp. 4760-4764.
Brown, H.R. "*The Adhesion Between Polymers*," Annu. Rev. Mater. Sci. 21, (1991) pp. 463-489.
Childs, William R., et al., "*Decal Transfer Microlithography: A New Soft-Lithographic Patterning Method*," J. Am. Chem. Soc. 124 (2002) pp. 13583-13596.
Choi, Jun-ho et al., "*Simple Detachment Patterning of Organic Layers and Its Application to Organic Layers and Its Application to Organic Light-Emitting Diodes*," Adv. Mater., 17, 2, (2005) pp. 166-171.
Coyer, Sean R. et al., "*Facile Preparation of Complex Protein Architectures with Sub-100nm Resolution on Surfaces*,"—Angew. Chem. Int. Ed. 46, (2007) pp. 6837-6840.
Duffy, David C. et al., "*Patterning Electroluminescent Materials with Feature Sizes as Small as 5 um Using Elastomeric Membranes as Masks for Dry Lift-Off*," Advanced Materials 11, 7, (1999) pp. 546-552.
Farrer, Richard A. et al., "*Selective Functionalization of 3-D Polymer Microstructures*," J. Am. Chem. Soc., (2006) 128 pp. 1796-1797.
Feng et al., "*Competing Fracture in Kinetically Controlled Transfer Printing*," Langmuir, 23, (2007) pp. 12555-12560.
Flachsbart, Bruce R. et al., "*Design and Fabrication of a Multilayered Polymer Microfluidic Chip with Nanofluidic Interconnects via Adhesive Contact Printing*," Lab Chip, 6, (2006) pp. 667-674.
Geissler, et al., "*Microcontact-Printing Chemical Patterns with Flat Stamps*,"J. American Chemical Society, 122 (2000) pp. 6303-6304.
Gent, A.N. "*Adhesion and Strength of Viscoelastic Solids. Is There a Relationship Between Adhesion and Bulk Properties?*," Langmuir, 12, (1996) pp. 4492-4496.
Gent, A. N. et al., "*Interfacial Bonding, Energy Dissipation, and Adhesion*," Journal of Polymer Science: Part B: Polymer Physics, 32 (1994) pp. 1543-1555.
Goto, S. et al., "*Fabrication Techniques for Multilayer Metalization and Patterning, and Surface Mounting of Components on Cylindrical Substrates for Tube-Shaped Micro-Tools*," IEEE Xplore (2008) pp. 217-220.
Huber R. et al., "*Fabrication of Multilevel Silicon Structures by Anisotropic Dee Silicon Etching*," Microelectronic Engineering (2003) pp. 410-416.
Jackman, Rebecca J., et al., "*Fabrication of Submicrometer Features on Curved Substrates by Microcontact Printing*," Science, New Series, 269, 5224 (1995) pp. 664-666.
Jackman, Rebecca J. et al., "*Three-Dimensional Metallic Microstructures Fabricated by Soft Lithography and Microelectrodeposition*," Langmuir, 15, (1999) pp. 826-836.
Jackman, Rebecca J. et al., "Design and Fabrication of Topologically Complex, Three-Dimensional Microstructures," Science, 280, (1998) pp. 2089-2091.
Jackman et al., "*Using Elastomeric Membranes as Dry Resists and for Dry Lift-Off*" Langmuir, 15 (1999) pp. 2973-2984.
Kawata, S. et al., "*Finer Features for Functional Microdevices*," Nature, 412, (2001) pp. 697-698.
Kendall, Kevin, "*Adhesion: Molecules and Mechnics*," Science, 263, (1994) pp. 1720-1726.
Kim, Changsoon et al., "*Micropatterning of Organic Electronic Devices by Cold-Welding*," Science, 288, 831 (2000) pp. 831-834.
Kim, Changsoon et al., "*Fabrication of Organic Light-Emitting Devices by Low Pressure Cold Welding*," Advanced Materials, 15, 6, (2003) pp. 541-545.
Kim, Dae-Hyeong et al., "*Stretchable and Foldable Silicon Integrated Circuits*," Science, 320, (2008) pp. 507-511., Suporting Online Material, Science Express 27 (2008) pp. 1-16.
Kim, J.K. et al., "*Low-Pressure Detachment Nanolithography*," Nanotechnology, 17 (2006)—pp. 940-946.
Kim, Jae Kwan, et al., "*On the Role of Surface Tensions and Process Conditions in Detachment Nanolithography*," Applied Physics Letters, 92 (2008)—pp. 223107-1-223107-3.
Kumar, Amit et al., "*Features of Gold Having Micrometer to Centimeter Dimensions Can Be Formed Through a Combination of Stamping with an Elastomeric Stamp and an Alkanethiol "Ink" Followed by Chemical Etching*," Applied Physics Letter 63, 14, (1993) pp. 2002-2004.
LaFratta, Christopher N. et al., "*Soft-Lithographic Replication of 3D Microstructures with Closed Loops*," PNAS, 103, 23, (2006) pp. 8589-8594.
Leong, Timothy G. et al., "*Surface Tension-Driven Self-Folding Polyhedra*," Langmuir, 23, (2007) pp. 8747-8751.
Li, Wen J. et al., "*Sensors and Actuators on Non-Planar Substrates*," Sensors and Actuators, 73 (1999) pp. 80-88.
Liang, Xiaogan et al., "*Graphene Transistors Fabricated via Transfer-Printing in Device Active-Areas on Large Wafer*," Nano Letters, 7, 12, (2007) pp. 3840-3844.
Meitl, Matthew A. et al., "*Transfer Printing by Kinetic Control of Adhesion to an Elastomeric Stamp*," Nature Materials, 5, (2006) pp. 33-38.
Michel, B. et al., "*Printing Meets Lithography: Soft Approaches to High-Resolution Patterning*," IBM Journal of Research & Development, 45, 5, (2001) pp. 697-719.
Packham, D.E. "*Work of Adhesion: Contact Angles and Contact Mechanics*," Int. J. Adhesion and Adhesives, 16, 2 (1996) pp. 121-128.
Penn, L.S. "*Relation Between Work of Adhesion and Work of Fracture for Simple Interfaces*," Journal of Materials Science 37 (2002) pp. 505-513.
Rogers, John A. "*Techniques and Applications for Non-Planar Lithography*," Mat. Res. Soc. Symp. Proc., 739, (2003) pp. H1.2.1-H1.2.8.
Rogers, John A. et al. "*Microcontact Printing and Electroplating on Curved Substrates: Production of Free Standing Three-Dimensional Metallic Microstructures*," Advanced Materials, 9, 6 (1997) pp. 475-477.
Seo, Soon-min et al., "*Transfer Fabrication Technique for Embedded and Inverted Micro/Nanostructures*," Applied Physics Letters, 88 (2006) pp. 023118-1-023118-3.
Seo, Soon-min et al., "*Micropatterning of Metal Substrate by Adhesive Force Lithography*," Applied Physics Letters, 86, (2005) pp. 133114-1-133114-3.
Syms, Richard R.A. et al., "*Surface Tension-Powered Self-Assembly of Microstructures—The State-of-the-Art*," Journal of Microelectromechnical Systems, 12, 4 (2003) pp. 387-417.
Walsby, E. D. et al., "*Multilevel Silicon Diffractive Optics for Terahertz Waves*," American Vacuum Society, (2002) pp. 2780-2783.
Wang, Zhe et al., "Micropatterning of Organic Semiconductor Microcrystalline Materials and OFET Fabrication by Hot Lift Off," J. Am. Chem. Soc., 125, (2003) pp. 15278-15279.
Whitesides, George M. et al., "*Soft Lithography in Biology and Biochemistry*," Annu. Rev. Biomed. Eng., 3, (2001) pp. 335-375.
Wu, Souheng, "*Polar and Nonpolar Interactions in Adhesion*," J. Adhesion, 5, (1973) pp. 39-55.
Xia, Younan et al., "*Soft Lithography*," Angew. Chem. Int. Ed, 37, (1998) pp. 550-575.
Xia, Younan et al., "*Unconventional Methods for Fabricating and Patterning Nanostructures*," Chem. Rev. 99 (1999) pp. 1823-1848.
Yang, Heng et al., "*A Single-Sided Multilevel Structure for Silicon Pressure Transducers by Masked-Maskless Etching Technology*," SPIE, 3223, pp. 185-188.
Yoon, Jongseung et al., "*Ultrathin Silicon Solar Microcells for Semitransparent, Mechanically Flexible and Microconcentrator Module Designs*," Nature Materials, 7, (2008) pp. 907-915, Additional attachment entitled "Supplementary Methods," pp. 1-24.
Yu, Jennifer et al., "*Micropatterning Metal Electrode of Organic Light Emitting Devices Using Rapid Polydimethylsiloxane Lift-Off*," Applied Physics Letters, 91, (2007) pp. 043102-1-043102-3.
Zhang, Y.Y. et al., "*Fabrication of Silicon-Based Multilevel Nanostructures Via Scanning Probe Oxidation and Anisotropic Wet Etching*," Nanotechnology, 16, (2005) pp. 422-428.
Zhou, Yangxin et al., "*A Method of Printing Carbon Nanotube Thin Films*," Applied Physics Letters, 88, (2006) pp. 123109-1-123109-3.

* cited by examiner

METHOD OF FORMING A PATTERNED LAYER OF A MATERIAL ON A SUBSTRATE

RELATED APPLICATION

The present patent document claims the benefit of the filing date under 35 U.S.C. §119(e) of Provisional U.S. Patent Application Ser. No. 61/298,757, filed Jan. 27, 2010, which is hereby incorporated by reference in its entirety.

FEDERALLY SPONSORED RESEARCH OR DEVELOPMENT

The invention described in the present patent document was funded in part by the National Science Foundation under Grant DMI-0328162. The U.S. government has certain rights in this invention.

TECHNICAL FIELD

The present disclosure is directed generally to patterning techniques for micro- and nanofabrication and more particularly to detachment-based patterning of photosensitive polymers and other materials.

BACKGROUND

Photosensitive materials, such as photoresists, are light sensitive materials, typically polymer-based, that may be patterned using photolithography and used to generate structural features ranging in size from tens of nanometers to centimeters. In photolithography, light is used to transfer a geometric pattern from a photomask to a photoresist film on a substrate, and parts of the film are then selectively removed in a developer, thereby defining the transferred pattern. The technology has proven successful for patterning photoresists on flat substrates and has been widely applied to the fabrication of microelectronic and MEMS devices.

In general, depositing and patterning polymers on non-planar substrates—such as etched, curved, or porous surfaces—remains difficult. Conventional methods of applying polymers to surfaces, including spin-coating and spraying, may result in coatings of non-uniform thicknesses when non-flat substrates are used. Significant challenges exist in adapting photolithography to three-dimension multiple level substrates and/or curved substrates due to its reliance on projection optics and the limited depth of focus.

BRIEF SUMMARY

A new method of forming a patterned layer of a material on a substrate is described here. The method is broadly applicable to a variety of materials, including polymers, metals, alloys, ceramics and biological materials.

The method entails forming a layer of a material on a stamp, and contacting the stamp with a first substrate comprising a pattern of protruding and recessed features to bring a first portion of the layer into conformal contact with the protruding features. The stamp is then removed from the first substrate. The first portion of the layer remains in conformal contact with the protruding features, and a second portion of the layer opposite the recessed features is removed with the stamp. Accordingly, a patterned layer is formed on the stamp inverse to the pattern on the first substrate. The method may further include transferring the patterned layer on the stamp to a second substrate.

Also described is a method of forming a structure on a substrate. The method entails forming a first layer comprising a photosensitive polymer on a stamp, and then contacting the stamp with a substrate comprising a pattern of protruding and recessed features, thereby bringing a portion of the first layer into conformal contact with the protruding features. An entirety of the first layer is transferred from the stamp to the substrate and the stamp is removed from the substrate. Material is removed from the first layer and a first patterned layer is formed on the pattern of protruding and recessed features. The first patterned layer comprises the photosensitive polymer.

DETAILED DESCRIPTION

Figures 1A, 1B, 1C, 1D, 1E:
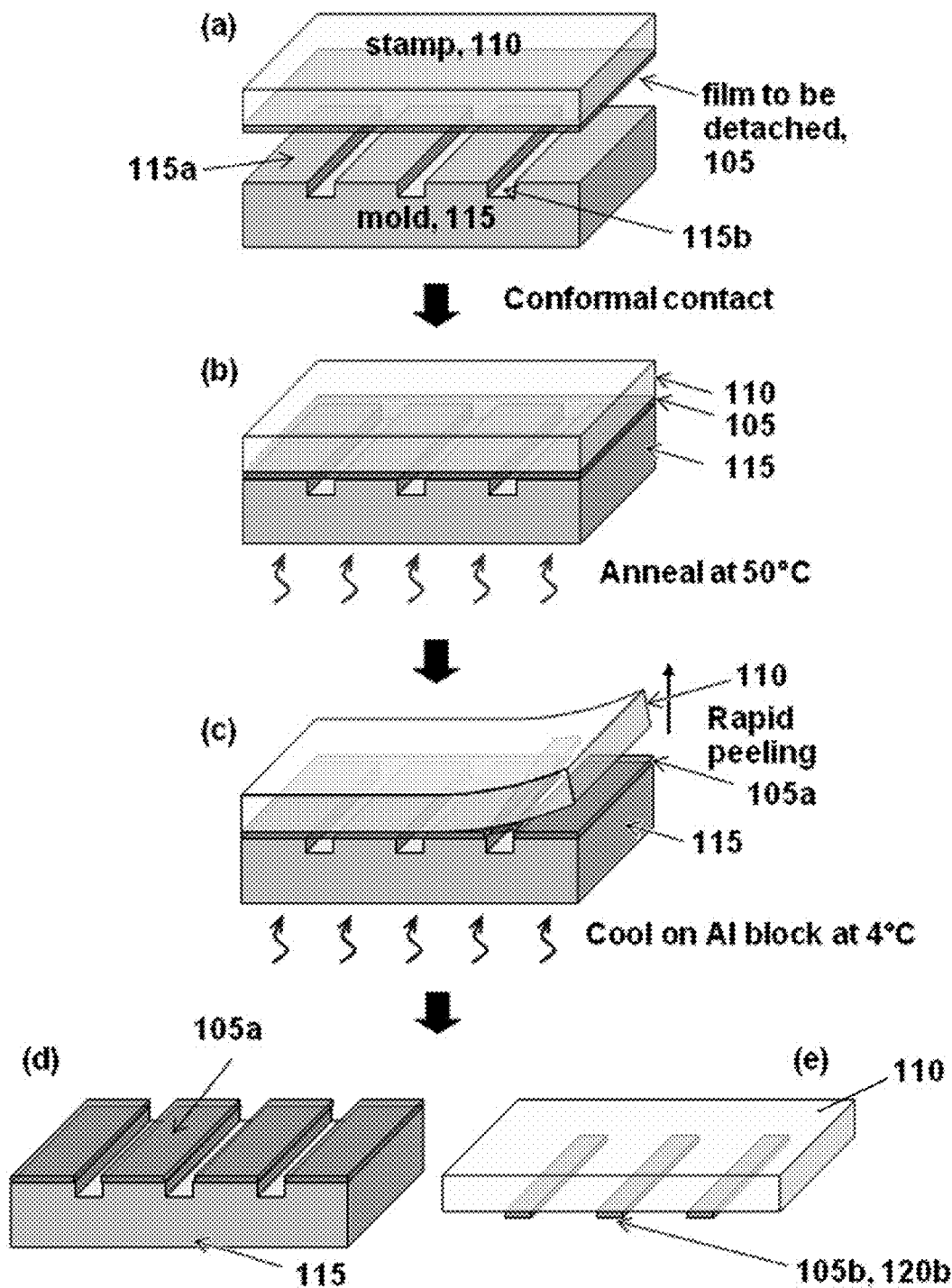
FIGS. 1(a)-1(e) are schematics of an exemplary detachment lithography process where (a) a photosensitive polymer (e.g., photoresist) is spin-coated on a flat PDMS stamp and brought into conformal contact with a Si mold that has etched patterns; (b) after annealing at 50° C., (c) the stamp is rapidly peeled away at the reduced temperature, (d-e) detaching the portions of the polymer that are not in contact with the mold.

Described here is a technique to create microscale patterns of various materials, such as functional polymers, on the surfaces of stamps and to transfer these patterns to planar and non-planar substrates. A film of a material is initially patterned through detachment lithography (DL), which utilizes differences in adhesion forces to induce mechanical failure in the film along the edges of the protruded parts of a mold. An elastomeric (e.g., polydimethylsiloxane (PDMS)) stamp with a kinetically and thermally adjustable adhesion and conformal contact can transfer detached patterns to etched or curved substrates, as well as to planar ones. When photosensitive polymers are employed, these printed patterns remain photochemically active for further modification via photolithography and/or can serve as resists for subsequent etching or deposition. As a result, photolithography can be used on highly non-conformal and non-planar surfaces. Various three-dimensional structures may be fabricated using the processes described here, and these structures have potential applications in MEMS sensors/actuators, optical devices, and microfluidics.

Referring to FIGS. 1(a)-1(e), the DL method entails forming a thin film 105 on an unpatterned, flat stamp 110 typically made of an elastomeric material (e.g., PDMS). The film 105 may be formed entirely or in part of a polymer, such as a photoresist or an epoxy, or another material such as a metal, an ahoy, a ceramic or bio/organic molecules. In the examples here, a polymer film 105 is employed. The polymer film 105 on the stamp 110 is then brought into conformal contact with a mold 115 that bears protruding and recessed features 115a, 115b on its surface. Upon removal of the stamp 110 from the mold 115, the portion 105a of the polymer film that makes contact with the protruding features 115a of the mold 115 tends to get transferred to the mold 115 surface, while the remaining portion 105b of the polymer film 105 tends to stay on the stamp 110. A difference in adhesion between the stamp-film interface and the film-mold interface permits tearing of the polymer film 105 along the edges of the protruded features 115a of the mold 115. Thus, the portion 105b of the polymer film 105 that remains on the stamp 110 is an inverted image 120b of the mold 115 that can be subsequently transferred to different planar/nonplanar substrates. This patterning technology may be referred to as detachment lithography. It is desirable to adapt the technology to photoresist films in particular, as they promise controllable transfer and resistance to harsh wet and dry etching environments. However, unlike materials employed in previous studies that are very thin (<100 nm) or have a low cohesive energy, photoresists have relatively high molecular weights (>10,000), a high cohesive energy (due to entangled chains), and a substantial thickness (often >1 μm), all of which may increase the difficulty of tearing or fracturing the film along the edges of the mold protrusions.

A challenge is to make the adhesion of the photoresist film adjustable, i.e., creating not only a strong enough adhesion so that sections of the photoresist can be selectively detached from the contiguous film, but also a weak enough adhesion to allow transfer of the detached patterns to other substrates. In previous DL processes, the films to be detached were deposited on a flat rigid substrate. After detachment, the materials picked up by the mold were neither used nor usable (due to irreversibly strong adhesion or other issues), and what was left behind on the substrate was of primary interest. An advantage here is that the detached patterns picked up by the stamp may be utilized and transferred to other substrates. The marriage between detachment lithography and kinetically and thermally adjustable adhesion of an elastomeric stamp has not been explored until now.

The patterning technology is now described in detail. A layer 105 comprising a functional polymer is formed on an elastomeric stamp 110, as shown in FIG. 1(a). The layer 105 may be formed by spin-coating, spraying, or another deposition technique. The stamp 110 is contacted with a first substrate (mold) 115 comprising a pattern of protruding and recessed features 115a, 115b to bring a first portion 105a of the layer 105 into conformal contact with the protruding features 115a, as depicted in FIG. 1(b). The recessed features 115b are regions of the first substrate 115 that are recessed relative to the protruding features 115a; they may be level with the surface of the first substrate 115 or recessed into the surface of the first substrate 115. The contact between the stamp 110 and the first substrate 115 may occur in a vacuum environment to minimize trapping of air or solvent bubbles at the interface between the layer 105 and the first substrate 115. Air or solvents may escape by diffusion through the elastomeric stamp 110.

The stamp 110 is then removed from the first substrate 115, as shown in FIG. 1(c). The first portion 105a of the layer 105 remains in conformal contact with the protruding features 115a (FIG. 1(d)) and a second portion 105b of the layer 105 opposite to the recessed features 115b is removed from the first substrate 115, along with the stamp 110 (FIG. 1(e)). Typically, the removal rate ranges from about 0.1 cm/s to about 50 cm/s. Accordingly, a patterned layer 120b is formed on the stamp 110 bearing an inverse image of the first substrate 115.

The stamp 110 is typically made of a compliant (e.g., flexible) material to facilitate removal by peeling from the mold (first substrate) 115. It is also contemplated that the mold 115 may be formed of a compliant material and thus peeled from a non-compliant stamp 110. Or both the mold 115 and the stamp 110 may be compliant. Advantageously, the stamp 110 is formed of a viscoelastic material such as PDMS.

The method may further include, prior to removing the stamp 110 from the substrate 105, heating the first substrate 105 to increase the adhesion between the first portion 105a of the layer 105 and the first substrate 115. The heating may be carried out at an elevated temperature in the range of from about 40° C. to about 110° C. A temperature of 50° C. may be particularly effective, although in some cases, the stamp 110 may be successfully removed from the first substrate 115 at room temperature. It may be beneficial to increase the hydrophilicity (or surface energy) of the first substrate prior to contacting the stamp with the first substrate by, for example, exposing the substrate to an oxygen plasma or a piranha solution.

To promote fracture and detachment of the layer 105 along interfacial regions defined by junctures of the first and second portions 105a, 105b, the first substrate, film layer, and (most importantly) the viscoelastic stamp may be cooled in order to carry out the removal (e.g., peeling) at a reduced temperature, such as between about −4° C. and room temperature. In some cases, however, detachment can take place at up to 60° C. The cooling may entail placing the first substrate on a surface having a temperature in the above-mentioned range, as described in more detail in the examples below.

Generally, the removal or peeling rate is balanced with the temperature and other process and product variables, including the pattern size and density, the film thickness, and the stamp thickness. After removing the stamp from the first substrate, the process can proceed in at least two ways. First, since the polymer layer 105a transferred onto the protruded part of the mold 115 as shown in FIG. 1(d) remains chemically or photochemically active, it can be used to modify the mold 115. Such processing has been carried out with photoresists transferred to silicon molds and is described in further detail below. Second, the polymer layer remaining on the stamp (and bearing the inverse image of the mold) can be transferred onto other substrates (FIG. 2a) in a printing process.

Successful detachment patterning and ensuing printing largely depend on an ability to tune the adhesion of an elastomeric stamp both kinetically and thermally. The viscoelastic nature of the stamp makes the adhesion between the solid objects and the elastomeric stamp sensitive to the speed and temperature at which the stamp is peeled away. If the stamp is peeled away from the mold with a sufficiently high peel velocity and at a reduced temperature, the adhesion between the stamp and the film become strong enough to fracture the film along the edge of the mold and lift the portion of the films that are not in contact with the mold. Conversely, if the detached patterns on the stamp are brought into contact with a receiving substrate and removed with a lower peel velocity and at elevated temperatures, a relatively weak adhesion of the stamp enables the detached patterns to be preferentially printed on the substrate. The inventors have found that changing the peeling speed alone may not achieve as high of a yield as reported here, and this is especially true in case of detachment.

Figures 3A, 3B:
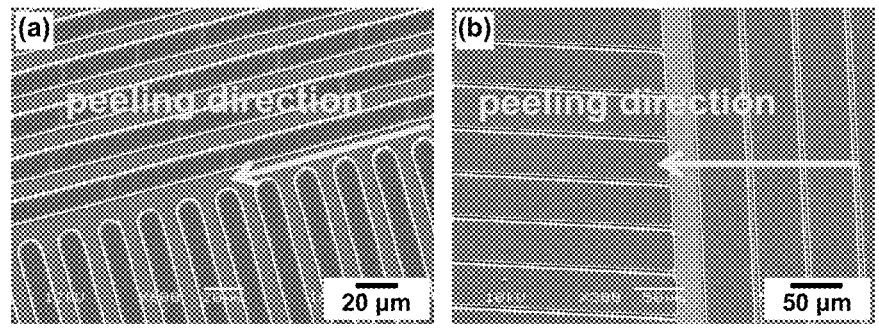
FIG. 3(a) is an SEM image showing the cracks of line patterns dependent on the peeling direction (resulting from the excess surface stress during peeling; and the SEM image of FIG. 3(b) shows the result of using a thicker PDMS stamp, where the surface stress is reduced such that the detached line patterns both perpendicular and parallel to the peeling direction are free of cracks.

Referring to FIGS. 3(a)-3(b), the peeling direction can also play a significant role in the quality of the detached films. When the photoresist film is detached across the mold with an array of line trenches running horizontally and vertically, the line patterns parallel to the peeling direction are more likely to crack. This cracking is due to excessive stress exerted on the surface of the stamp during peeling. Thus, when the pattern of protruding and recessed features on the mold comprises an array of substantially parallel linear features, it may be advantageous to carry out the peeling in a direction nonparallel to the linear features. For example, the peeling may be carried out in a direction substantially perpendicular to the linear features.

The inventors have found that, in general, discrete patterns such as squares and circles are much less susceptible to cracking than continuous patterns. Typically, the bending stress of the member with the rectangular cross-section is inversely proportional to its thickness squared. With the same peel force applied to the stamp, the cracking of the line patterns can be reduced by doubling the thickness of the stamp (e.g., from 5 mm to 1 cm).

The pattern size generated using the inventive method typically ranges from a few microns to a few millimeters. However, there is no fundamental limit to the size of the features that may be printed using this method, and patterns having features and spacings in the nanometer-scale size regime are believed to be possible.

Typically, the width and spacing of lines that can be patterned via detachment lithography are from about 3 microns to about 1,000 microns. For example, photoresist Shipley 1805 may have a thickness spanning from about 0.5 micron to about 2 microns. The minimum feature size (e.g., about 3 microns) is obtained when the film is spun to the smallest thickness (e.g., about 0.5 microns). In contrast to Shipley 1805, one of the thinnest photoresists, a thick photoresist such as AZ4620 has the higher molecular weight and gives a thickness of from about 5 microns to 15 microns, leading to a much larger minimum feature size patterned with detachment lithography.

Figures 2A, 2B, 2C, 2D, 2E, 2F, 2G:
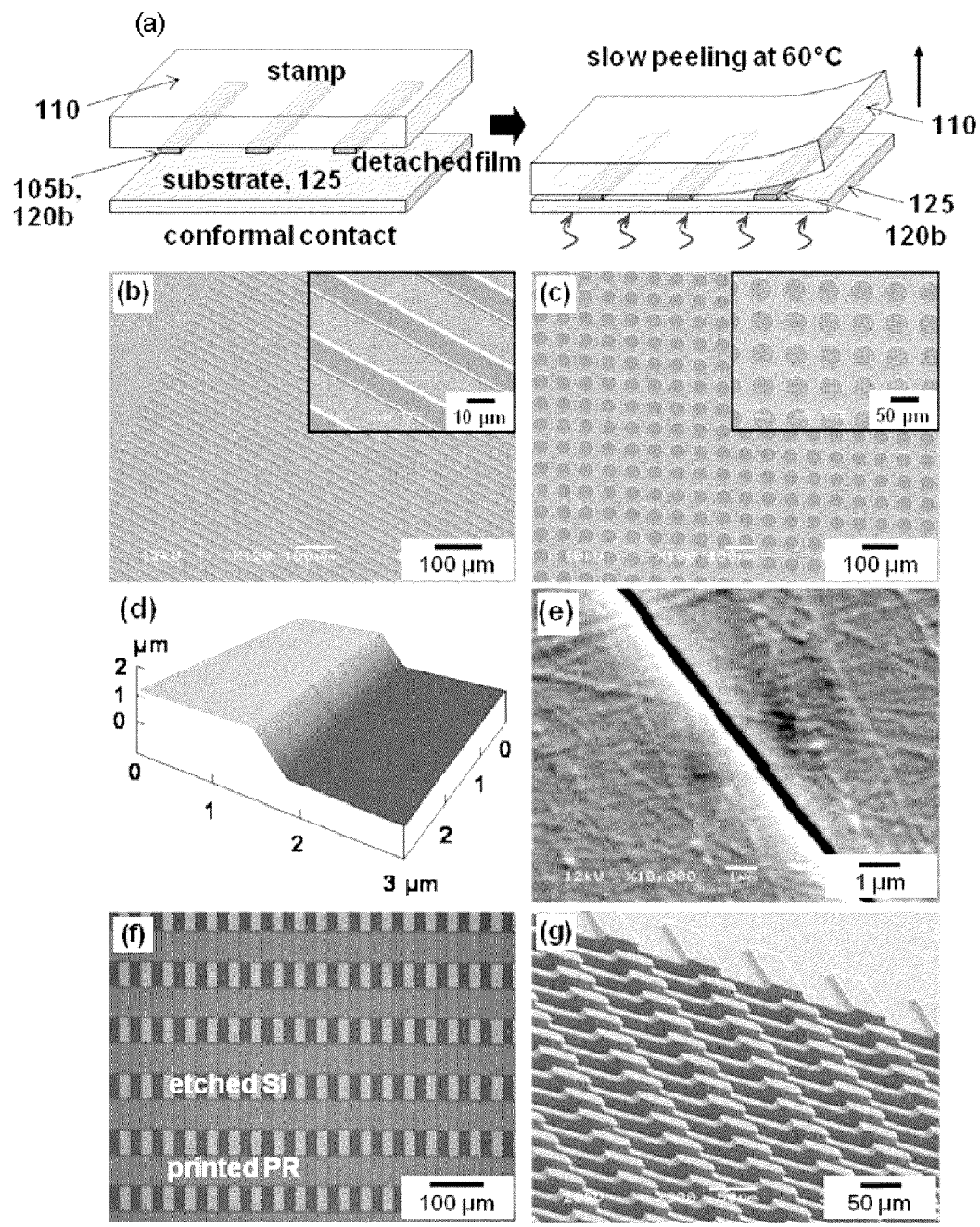
FIG. 2(a) shows detached photoresist patterns being transferred to planar substrates after achieving conformal contact and slowly peeling the stamp away at an elevated temperature.
FIGS. 2(b) and 2(c) are SEM images of 0.85 µm-thick photoresist S1805 formed in an array of 10 µm lines separated by 20 µm (b) and 50 µm circles separated by 20 µm (c), where the insets are zoomed-in images.
FIG. 2(d) is an 3-D atomic force microscope (AFM) image of the profile of the transferred photoresist S1805 film on a coverglass (thickness=1.2 µm)
FIG. 2(e) shows an SEM image of nanoscale roughness on the transferred photoresist film due to nanometer-scale scratches and dents on the PDMS surface.
FIG. 2(f) is an optical microscope image of an array of the 50 µm-wide lines of the transferred photoresist AZ1518 (2.7 µm thick) on the 200-µm-etched Si trenched.
FIG. 2(g) shows two-step etched Si structures resulting from DRIE etching of the structure of FIG. 2(f) using the photoresist as a mask.
Figures 5A, 5B, 5C:
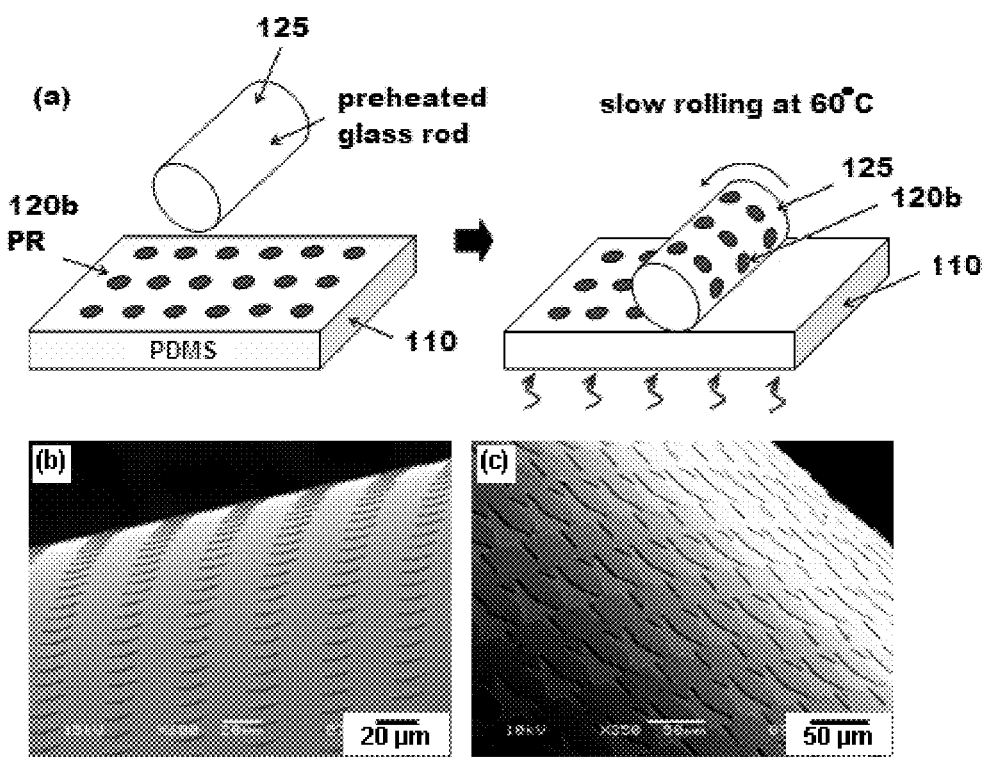
FIG. 5(a) depicts a procedure for transferring the patterned photoresists onto curved surfaces by slowly rolling a heated cylinder across the stamp to pick up the photoresist patterns.
FIGS. 5(b)-5(c) show SEM images of an array of 10 µm by 10 µm squares separated by 20 µm and an array of 100 µm wide star-shaped holes on the glass cylinder of 6 mm diameter, respectively, where the photoresists used are S1508 and 0.85 µm thick.

As indicated above, and referring to FIG. 2(a), the patterned layer 120b formed by detachment lithography on the stamp 110 may be transferred to a second substrate 125, which may be a flat, curved and/or fragile substrate. To carry out the transfer, the patterned layer 120b is contacted with the second substrate 125 and relative motion between the stamp 110 and the second substrate 125 is induced: either the stamp 110 is removed (e.g., peeled) from the second substrate 125 or the second substrate 125 is moved over the stamp 110 to transfer the patterned layer 120b. For example, referring to FIG. 5(a), the second substrate 125 may have a cylindrical shape and may be rolled over the stamp 110 in order to effectively transfer the patterned layer 120b to the curved surface of the substrate 125. Generally, the transfer occurs at a rate ranging from about 0.01 cm/s to about 1 cm/s.

Although the detachment lithography-transfer printing (DL-TP) process was originally developed for photosensitive polymers, the technique can be extended to other functional polymers, such as epoxy and adhesives. Functional polymers are polymers that have, in addition to cohesive molecular properties, active optical, electronic, and/or chemical properties; examples include photoresists, epoxies, adhesives, semiconducting polymers, and catalytic polymers. In one example, DL-TP of an adhesive layer has been shown to be effective for creating one-dimensional (1D) or two-dimensional (2D) nanochannels, as discussed in detail in the Examples that follow.

Also, in some cases, it may be advantageous to transfer a contiguous film—as opposed to a patterned film—from the stamp to a substrate. Such a process may be referred to as blanket transfer (BT) and is also described further below.

As discussed above, the stamp 110 is typically made of a compliant material (e.g., a viscoelastic polymer such as PDMS) to facilitate removal from the first and second substrates 115, 125. It is also contemplated that the second substrate 125 may be formed of a compliant material to facilitate peeling from a non-compliant stamp. In some cases, it may be advantageous for both the second substrate 125 and the stamp 110 to be compliant.

Additionally, the second substrate 125 may be heated to a temperature ranging from about 40° C. to about 110° C. prior to transferring the patterned layer 120b in order to facilitate the transfer. Depending on the pattern size, film thickness, molecular weight/degree of polymerization of the polymer, etc., carrying out the transfer at room temperature may also work.

Returning to FIG. 1(d) and the polymer layer 105a remaining on the mold, the method may further entail patterning the first portion of the layer in conformal contact with the protruding features of the first substrate (mold) to form an etch mask on the first substrate. Then, multilevel features may be created in the first substrate, as discussed in further detail below.

EXAMPLES

Fabrication of Stamp and Mold

A flat PDMS stamp is prepared by casting a mixture of prepolymer (Sylgard 184, Dow Corning) and a curing agent in the ratio of 10 to 1 against a clean glass plate. After curing PDMS cast at 60° C. for 24 hours, the PDMS sheet is cut into a disk of 5 cm diameter and removed from the glass plate. The round shape of the PDMS stamp helps to minimize the edge-bead that may build up during spin-coating of photoresist. A silicon mold is fabricated using standard photolithography and subsequent DRIE etching methods with AZ 1518 photoresist as a mask. After stripping off the photoresist, the mold may be cleaned in either a piranha solution ($H_2SO_4:H_2O_2=3:1$) or an SC-1 solution ($H_2O:H_2O_2:NH_4OH=100:10:1$) to increase the hydrophilicity of the mold surface (i.e., to enhance the surface energy). For the oxygen plasma treatment, a reactive ion etcher (March Jupiter III) with 100 W of an RF power and 60 sccm of an oxygen flow rate may be used. A molecular vapor deposition tool (MVD Model 100, Applied Microstructures) is used to coat a FDTS monolayer on the Si mold, producing 112° of the contact angle.

Detachment Lithography of Photoresist Films and Subsequent Pattern Transfer to Planar and Non-Planar Substrates An exemplary experimental procedure for detachment lithography is described here. First, a thin film of photoresist (from about 0.5 μm to about 3 μm in thickness) is spin-coated onto a flat elastomeric stamp. For example, Shipley 1805 may be spin-coated onto the PDMS stamp at 1000, 4000, 7500 rpm for 30 s, resulting in film thicknesses of 1.6 μm, 0.85 μm, and 0.56 μm, respectively. For AZ 1518, spin-coating at 5000 rpm for 30 s produces a 2.7 μm thick film on PDMS.

Once spin-coated, the film on the PDMS stamp is cured at 50° C. on a hotplate for 60 s and brought into contact with the Si mold at the same temperature, as depicted in FIGS. 1(a)-1(b). The photoresist film on the PDMS stamp comes into conformal contact with protruding features on the mold and is attached to the features by van der Waals interactions. No additional pressure is required to ensure the conformal contact between the film and the mold due to the high compliance of the PDMS stamp. In cases where air or solvent bubbles may be trapped at the interface, forming the conformal contact in a vacuum environment may help air or solvents to escape through the PDMS, thereby improving the consistency of the results. The stack (stamp mold) is left on the hotplate for an additional 60 s and then moved onto a cold aluminum block stored at 4° C. refrigerator to promote the fracture and detachment of the film.

A minute later, the PDMS stamp is rapidly (~10 cm s$^{-1}$) peeled away from the mold for detachment, as shown schematically in FIG. 1(c). High aspect ratio features in the Si mold may be damaged if the stamp is removed too quickly because of the strong adhesion. The stamp should not be bent or squeezed once peeled because excessive stresses on the surface of the stamp may cause the detached photoresist patterns to crack or wrinkle.

When the stamp is removed from the Si mold with a high peeling speed (>10 cm s$^{-1}$), regions of the photoresist film in contact with the protruded parts of the mold are detached, leaving the opposite patterns of the photoresist on the stamp (see FIG. 1(c)). The fast peeling speed of the stamp at the reduced temperature increases the adhesion between the stamp and the film, improving the detachment yield; the percentage of successful pattern transfer is more than 90% over a 4 by 4 cm$^2$ area.

No special surface treatment is required on the Si mold surface. It is found, however, that the quality of conformal contact depends on the wettability of the film, and thus the Si mold may be exposed to an oxygen plasma or piranha solution, which renders its surface more hydrophilic, prior to bringing it into contact with the film.

The portion of the photoresist film remaining on the stamp after removal from the mold can subsequently be transferred, or "printed," to a planar or nonplanar substrate, as described below.

Printing Detached Patterns to Planar Substrates

The photoresist patterns remaining on the PDMS stamp (FIG. 1e) after the detachment lithography process may be brought into conformal contact with a planar receiving substrate (FIG. 2(a)). To reduce the interfacial adhesion between the stamp and the photoresist film and to ease printing of the patterns to the receiving substrates, the stamp may be peeled away at a slower rate and an elevated temperature (~60° C.). Because there is better control over peeling at a slow speed, a higher yield (~99%) of printing is observed compared to detachment. Higher yields for both steps are potentially possible with more precise process control.

Scanning electron micrograph (SEM) images of various printed photoresist patterns on glass slides are shown in FIG.

2(*b*)-2(*c*). The AFM 3-D profile of the printed photoresist patterns on coverglass demonstrate that the detachment lithography process produces sharp edges and no residual photoresist film between the patterns (FIG. 2(*d*)). Due to the reversible adhesion of PDMS and removal of the photoresist by mild solvents, both the stamp and the mold are repeatedly usable (more than a hundred times) as long as the stamp surface is treated with care. Scratches and dents of nanometer-scale on the PDMS surface may induce nanometer- or micrometer-scale features on the surface of the transferred photoresist patterns (FIG. 2(*e*)). These defects on PDMS are typically generated from physical cleaning of the stamp, such as rubbing. But in most applications as a resist, these small features on photoresists do not influence its function. The patterned photoresist films can also be transferred (or printed) to the planar substrate etched with the high aspect ratio trenches (see FIGS. 2(*f*) and 2(*g*)).

Figures 4A, 4B, 4C, 4D:
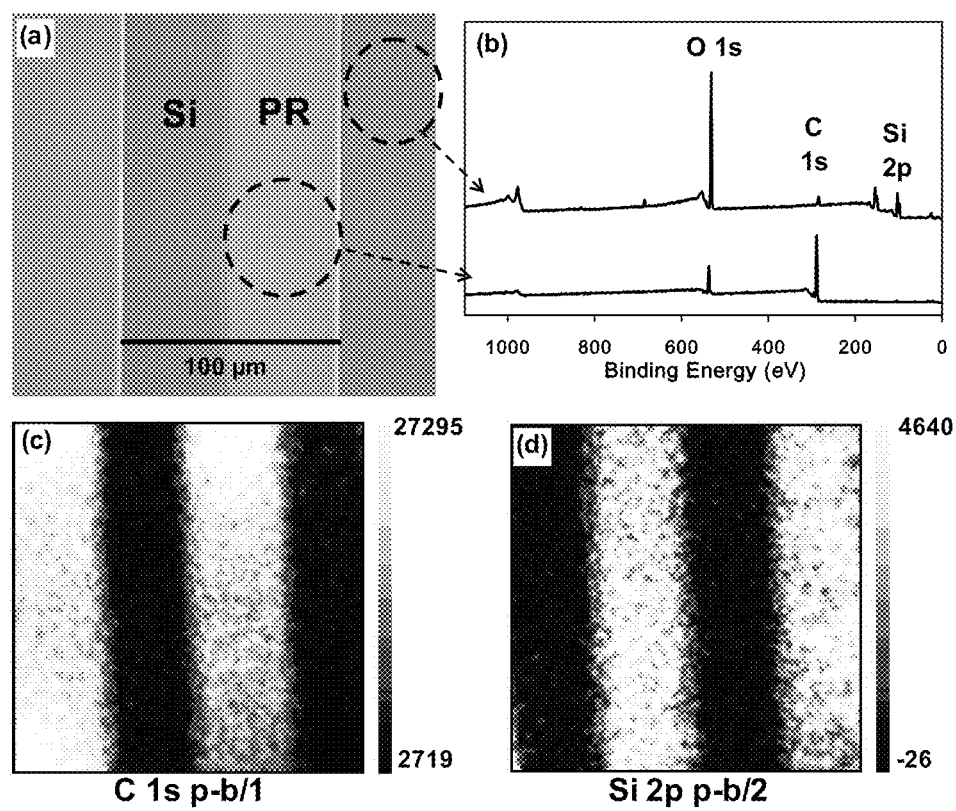
FIG. 4(a) shows an optical micrograph image of the detached photoresist S1805 patterns later transferred onto a Si substrate.
FIG. 4(b) shows XPS survey scans of two different regions.
FIGS. 4(c) and 4(d) show C 1s and Si 2p photoelectron images, respectively, acquired at 160 eV pass energy in 440 sec.

The completeness of detachment is investigated using surface analysis techniques. FIG. 4(*a*) shows an optical microscope image of an array of 0.85 µm-thick S1805 line patterns (50 µm wide and 50 µm spacing) printed onto a Si substrate from a PDMS stamp after detachment. XPS survey scans from two different regions (FIG. 4(*b*)) and the 2-D elemental images (FIG. 4(*c*)-4(*d*)) indicate the presence of Si in the detached region and a distribution of C in the photoresist region. Note that the brightness of the 2-D images corresponds to the intensity of each elemental signal (carbon for FIG. 4(*c*) and silicon for FIG. 4(*d*)) picked up by the XPS detector, which precisely corresponds to the optical microscope image of FIG. 4(*a*). Prior to transferring the photoresist patterns onto the Si substrate, the surface of the PDMS stamp, where the photoresist film is detached, is probed using Raman spectroscopy, as described below in the Supplemental Experiments section. The line profile across the photoresist patterns in FIGS. 9(*a*)-9(*b*) indicates that no apparent photoresist residue is observed in the detached regions, which is consistent with the AFM image of FIG. 2(*d*).

Printing Detached Patterns to Curved Substrates

Referring again to FIG. 1(*e*), a photoresist pattern remaining on the stamp after detachment lithography may be transferred from the surface of the stamp onto the surface of a curved object.

As a piranha-cleaned glass rod is rolled across the surface of the stamp, for example, the photoresist patterns may be transferred from the stamp to the rod surface (FIG. 5(*a*)). Pre-heating the rod to 60° C. and slow rolling help to increase a yield of printing onto the rod surface, as for the planar case. The process developed here does not require any specific surface treatment or specialized equipment and can be extended to different types of polymers and organic molecules.

Prior to printing, the receiving substrates, including flat glass plates; glass cylindrical rods, and etched Si wafers, are cleaned in either a piranha or SC-1 solution to create hydrophilic surfaces, and then stored in an oven at 60° C. The detached photoresist patterns are brought into conformal contact with the glass plate or Si wafer on the hotplate at 60° C. for 60 s, and the stamp is slowly (<0.5 cm s$^{-1}$) peeled away from the substrate. In the case of curved substrates, a rod is rolled across the stamp at a slow rate on the hotplate at 60° C.

SEM images of printed photoresist patterns obtained from the method are shown for an array of 10 µm by 10 µm squares (FIG. 5(*b*)), and an array of 50 µm wide star-shaped holes (FIG. 5(*c*)) on the glass cylinder of 6 mm diameter.

Figure 10:
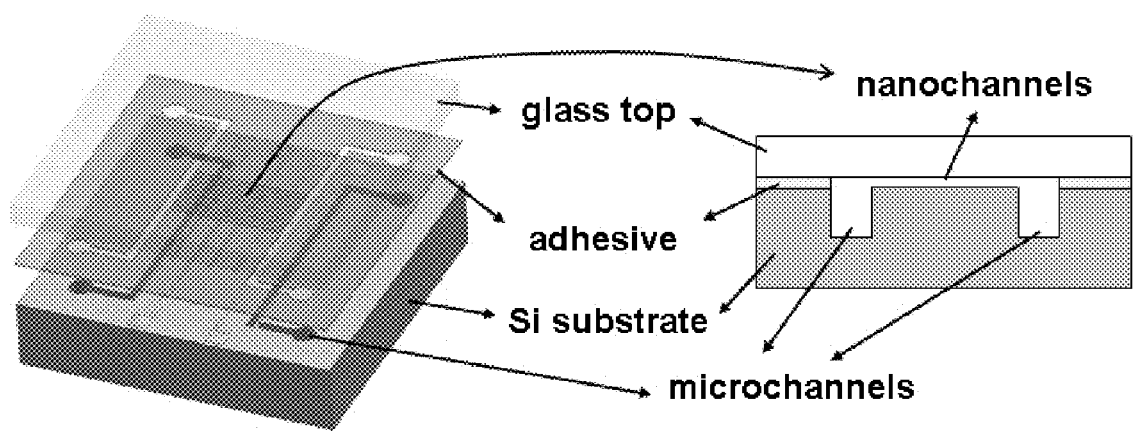
FIG. 10 shows (left) a birds-eye view of an exemplary nanochannel device that may be created using a detachment lithography-transfer printing (DL-TP) process with an adhesive film and (right) a cross-sectional view of the exemplary device.

Detachment Lithography and Subsequent Transfer Printing (DL-TP) of a Patterned Adhesive Layer DL and subsequent transfer printing (TP) of an adhesive layer may be employed to create one-dimensional (1D) or two-dimensional (2D) nanochannels efficiently and inexpensively. FIG. 10 shows a schematic of an exemplary nanochannel device, in which two parallel microchannels are bridged by an array of nanochannels. DL-TP is employed to pattern thin adhesive films and create nanochannels on the substrate using the patterned adhesive layers as channel walls.

Figure 11:
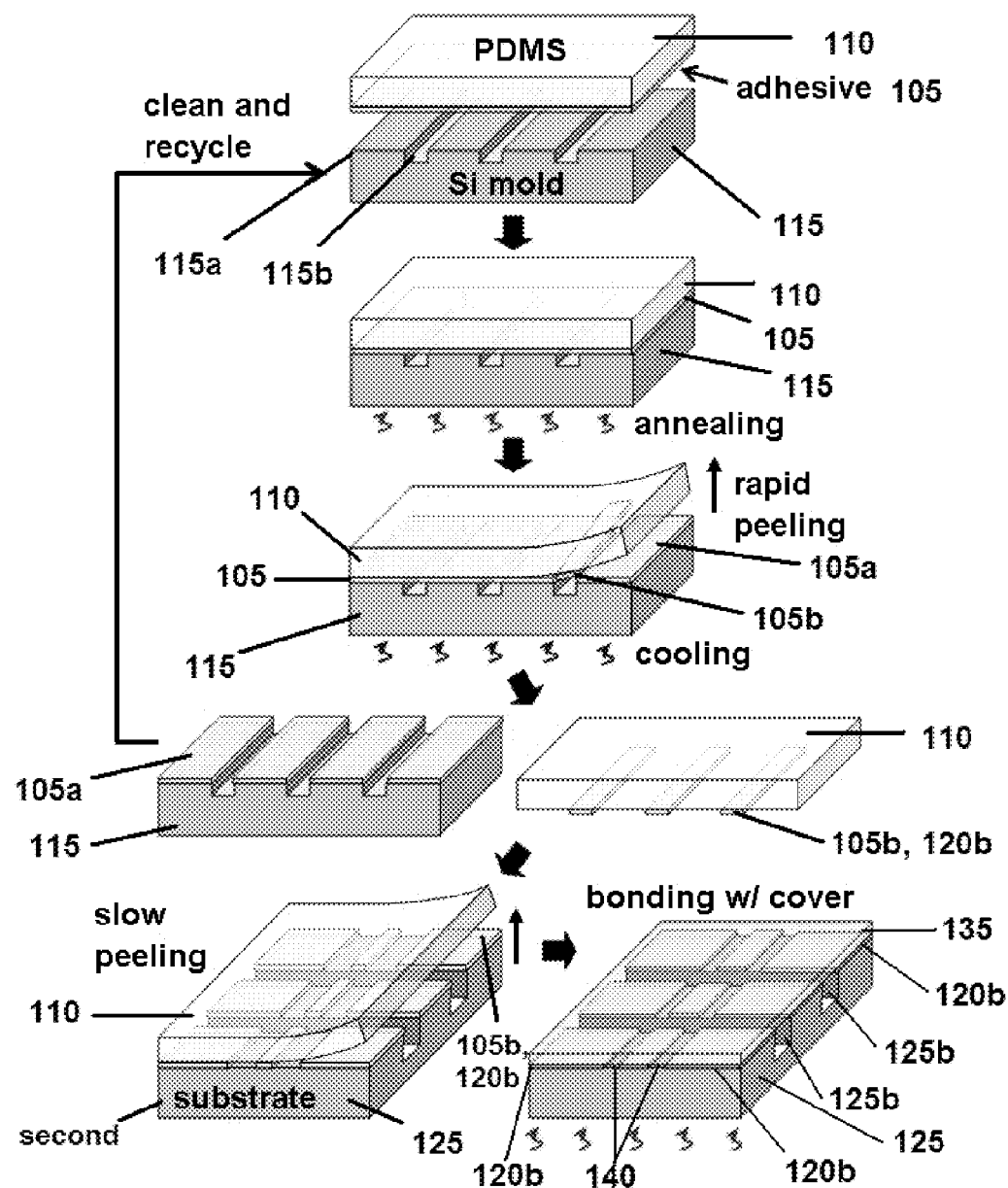
FIG. 11 shows an exemplary process sequence of DL-TP and formation of nanochannels between a cover plate and a substrate with pre-etched microchannels.

FIG. 11 shows a process sequence of DL-TP of an adhesive film 105. To carry out the process, the adhesive film on a flat elastomeric stamp 110 is brought into contact with a rigid mold 115 (which has protruding features 115*a* such as an array of lines), and then the stamp 110 is peeled: away from the mold 115, tearing: the adhesive film 105 in a controlled fashion and detaching the portions 105*b* of the film 105 that are not in contact. The detached adhesive pattern 120*b* is subsequently transferred to a base substrate 125 and bonded with a cover plate 135. While the adhesive layer 105*b*, 120*b* serves as a bonding agent to seal the fluidic channels 125*b*, the gaps created by the detachment patterning become nanofluidic channels 140 upon bonding. The fabrication of 1D or 2D nanofluidic structures with patterned adhesive films has not previously been demonstrated.

An example of the DL-TP process is now described in reference to specific experiments. A fresh epoxy-based adhesive solution is prepared, and the solution is diluted with solvents in order to lower its viscosity. A thin adhesive film (tens to hundreds of nanometers thick) is spin-coated onto the elastomeric stamp, and the stack is brought into intimate contact with a Si mold (which may also be referred to as a master surface). The Si mold has pre-etched features that will define the pattern of the adhesive film, e.g. an array of lines and spaces. Heat is applied to the stack to help the film to adhere to the mold surface. The stamp-film stack is then immediately moved to a cooling block that may be refrigerated at, for example, 4° C. As the stamp is rapidly peeled away, the portions of the adhesive film in contact with the protruded parts are likely to get transferred to the mold surface, while the portions that are not in contact will likely remain on the stamp surface.

Detached and picked up by the stamp, the patterned adhesive layer can be subsequently printed onto a receiving substrate, which may be referred to as transfer printing. The patterned film on the stamp is brought in contact with the substrate, and then the stack is placed on a hotplate (or oven) at moderate temperature (i.e. 60° C.). After some time, the stamp is removed slowly from the corner, transferring the film to the substrate. The transferred adhesive layer has not been exposed to high temperature and/or any solvents during the process, and so its functionality is reserved. The patterned film may be sandwiched between two flat plates (e.g., coverglass) and heated to a temperature at which the adhesive becomes active and crosslinked. Referring to FIG. 11, as the two plates 135, 125 are bonded, gaps generated by the adhesive pattern 120*b* become nanochannels 140 that connect microchannels 125*b*. The nanochannels 140 are enclosed by two adhesive sidewalls 120*b* and glass top/silicon bottom walls 135, 125.

Figure 12:
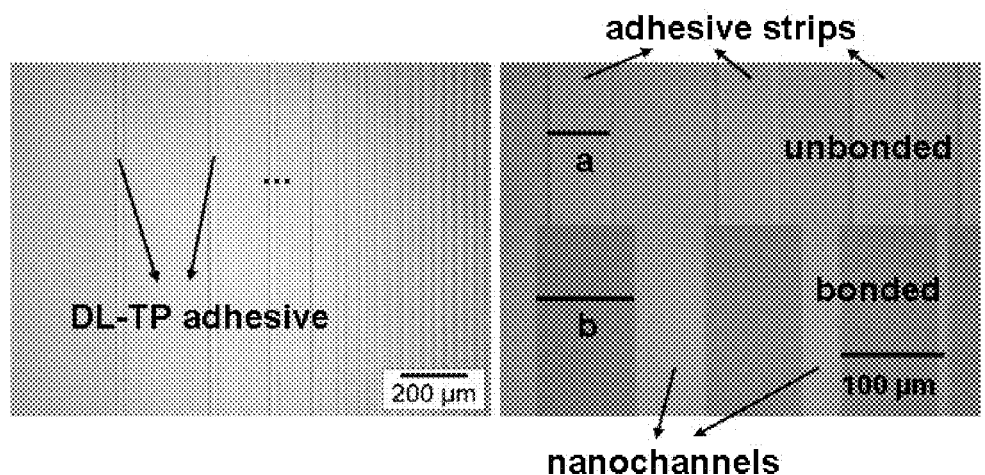
FIG. 12 shows optical microscope images of (left) strips of adhesive patterned by a DL-TP process and (right) the adhesive strips before and after bonding with a glass plate.

Optical microscope images in FIG. 12 (left) show an exemplary array of adhesive strips that were patterned by DL and transfer-printed onto a coverglass. The width (~25 µm) of the strips is constant but separated by different spacings. The thickness of the strips shown here is 250 nm. When these adhesive strips are employed to bond two glass plates, nanochannels are formed between two strips.

Figure 13:
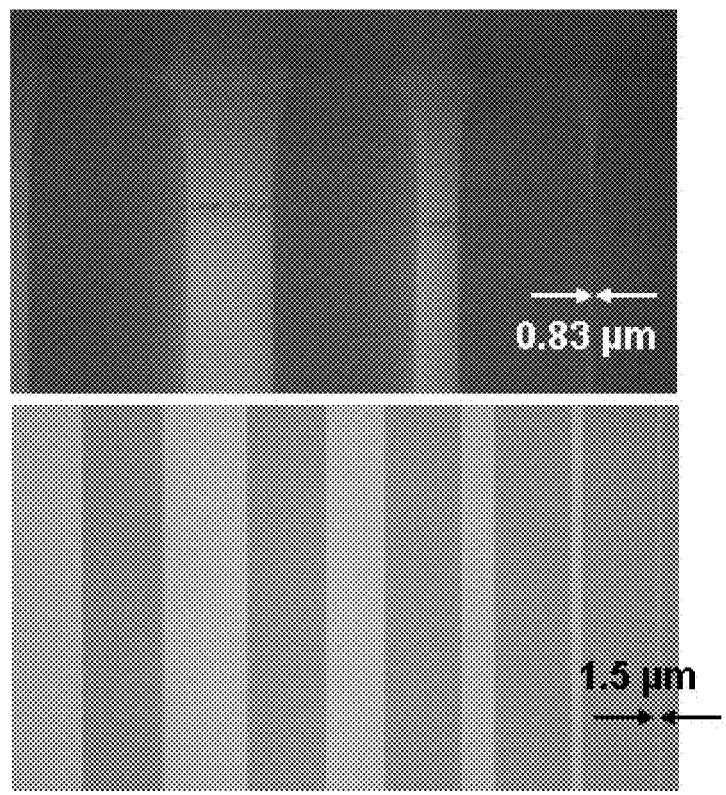
FIG. 13 shows optical microscope images of an array of nanochannels with a width of (top) 0.83 μm and (bottom) 1.5 μm at smallest.

The darker bands in FIG. 12 (right bottom) are the adhesive strips squeezed by two plates, and the lighter bands are the nanochannels. Note that the pressure (1~1000 N/cm²) and temperature (100~150° C.) during bonding make the adhesive mobile and it spreads out, narrowing the widths of nanochannels. A spreading ratio may be defined by measuring the width of an adhesive strip before (a) and after (b) bonding, thus the spreading ratio=b/a. This ratio is highly dependent on the bonding pressure and temperature as well as the adhesive thickness. Since the adhesive is squeezed during bonding, its thickness and thus the nanochannel height can be further reduced. In addition, a nanochannel of a submicron width can be fabricated without a high-resolution mold. When the gap distance between two strips is, say 10 μm, defined by a Si mold, nanochannels of widths of 0.83 μm and 1.5 μm are formed as shown in FIG. 13. Both the width and the height of the nanochannels can be made in the submicron regime using an inexpensive mask set. The uniformity in the thickness of the patterned adhesive strips also facilitates the fabrication of the nanochannels of equal height across a large area of the substrate (e.g., over 25 cm²).

Figure 14:
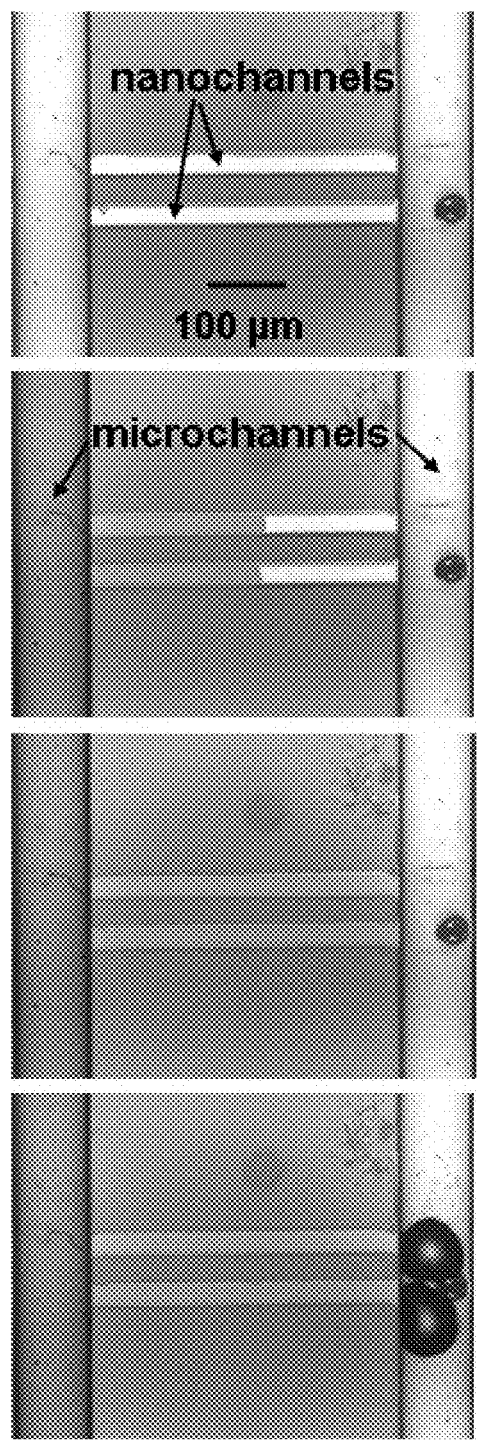
FIG. 14 shows optical micrographs of snapshots at different times during a liquid (DI water) filling test on an exemplary nanochannel device.

FIG. 14 shows a liquid filling test for the fabricated device. Two nanochannels of 50 μm wide and 100 nm high bridge two parallel microchannels (300 μm wide and 100 μm tall). Microchannels are etched in a Si die, which is bonded with a glass top using the transferred adhesive layer. DI water is first introduced into the left side, and by capillary force, nanochannels are rapidly (in less than 30 ms) filled.

There are a number of advantages of fabricating nanochannels using adhesive films patterned by DL-TP. Since an adhesive is used as a bonding agent, a much wider selection of substrate materials can be integrated in a nanofluidic system; for example, metal as well as ceramic substrates can be bonded with the adhesives. In contrast, fusion bonding works only for Si to Si surfaces, anodic bonding for Si to glass surfaces, and eutectic bonding for two Au surfaces.

Also, while the bonding temperature depends on the type of the adhesives, a thermally-cured adhesive requires less than 130° C. and a UV curable adhesive enables room-temperature bonding. Low temperature processing facilitates using polymer substrates and the fabrication of all-polymer and multilayer (stacked) nanochannels. Low process temperatures also allow for the integration of temperature sensitive materials (e.g., metal electrodes or self-assembled monolayers) into nanochannels. Other advantages include the very high aspect ratio (width to height ratio of over 100) nanochannels that may be fabricated, and the possible extension of DL-TP to a roll-to-roll process that may be highly scalable and inexpensive.

Blanket Transfer Process and Applications

In a blanket transfer (BT) process, a contiguous film that has not been patterned is transferred in its entirety from a stamp to a substrate. The film transferred to the target substrate can serve not only as an etch mask for a subtractive process but also may be used for an additive process. Using single or multiple transfers of photosensitive films by BT, the fabrication of various polymeric structures such as multilayer, free-standing, and re-entrant structures is possible.

Figure 15:
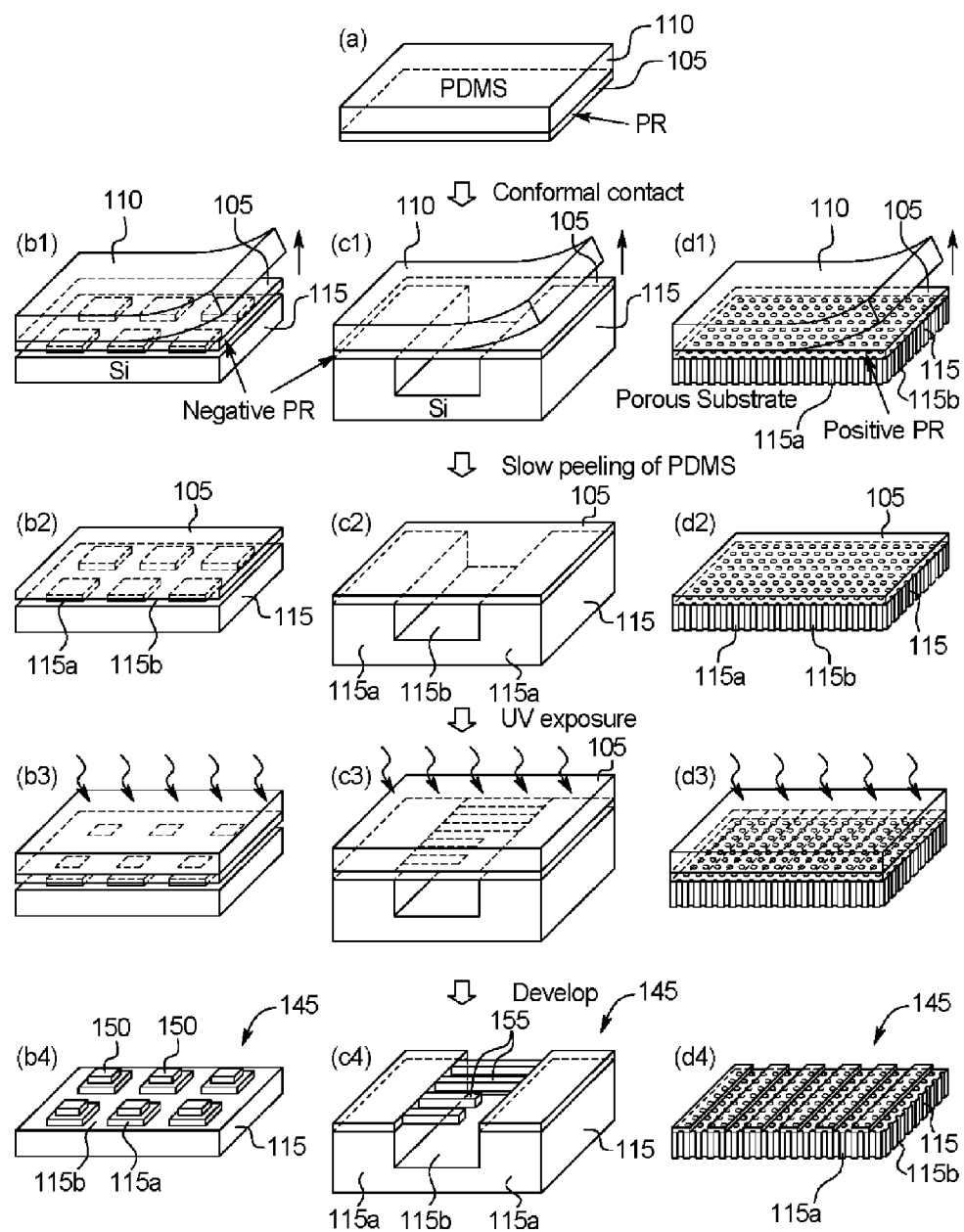
FIG. 15 shows an exemplary fabrication sequence of (b1-b4) multilayer polymeric structures, (c1-c4) free-standing polymeric structures, and (d1-d4) patterning of a porous membrane.

FIG. 15 illustrates a schematic of the BT process and three examples of the enabled structures/applications. The BT process entails forming a first layer 105 comprising a photosensitive polymer on a stamp 110 (FIG. 15(a)), and then contacting the stamp 110 with a substrate 115 comprising a pattern of protruding features 115a and recessed features 115b, thereby bringing a portion of the first layer 105 into conformal contact with the protruding features 115a of the substrate 115, as shown in FIGS. 15(b1), 15(c1) and 15(d1). The protruding features 115a may be defined by additional material deposited on the substrate 115, as shown in FIG. 15(b2), where the recessed features 115b are defined by portions of the substrate 115 therebetween, or the protruding and recessed features 115a, 115b may be formed directly into the substrate 115, as shown in FIG. 15(c2). Alternatively, the recessed features 115b of the substrate 115 may be pores and the protruding features 115a of the substrate 115 may be the material surrounding the pores, as shown in FIG. 15(d2).

Next, an entirety of the first layer 105 is transferred (blanket transfer) from the stamp 110 to the substrate 115 by removing the stamp 110 while the portion of the first layer 105 remains in conformal contact with the protruding features 115a. Material is then removed from the first layer 105 by photolithographic patterning to form a patterned layer 145 of the photosensitive polymer on the pattern of protruding and recessed features 115a, 115b. Referring to FIG. 15(b4), one or more multilayered structures 150 may be created by portions of the patterned layer 145 that overlie protruding features 115a of the substrate 115. Referring to FIG. 15(c4), partially unsupported structures 155 may be created by portions of the patterned layer 145 that overlie recessed features 115b of the substrate 115. As shown in FIG. 15(d4), the patterned layer 145 may overlie a porous substrate 115.

The BT process is now described in greater detail with respect to specific experiments that have been carried out. Photoresist was first spin-coated onto a flat PDMS stamp, and the resultant film on the stamp was cured at 60° C. for between 2 and 5 minutes. Curing is beneficial for driving away excessive solvents, making a film sturdier for the subsequent process. The thickness of the film is dependent on the speed of spin coating, and the proper curing time and temperature can be adjusted for the type and thickness of photoresist. The photoresist film is then brought into contact with the receiving substrate, and heat (e.g., ~60° C.) may be applied to the stack to enhance the adhesion between the film and the substrate. Upon peeling the PDMS stamp from the stack, the photoresist film is transferred to the substrate. The desired blanket transfer takes place when the adhesion force between the photoresist film and the substrate is greater than the adhesion between the photoresist film and the stamp, as discussed further below. The utility of the PDMS stamp is that its viscoelastic nature allows its interfacial adhesion to be adjusted kinetically and thermally, e.g., the higher the peeling velocity and/or lower the peeling temperature, the stronger the adhesion between the stamp and the film. In blanket transfer, the adhesion between the stamp and the film is preferably minimized, and therefore the peeling may take place at a slow speed and an elevated temperature.

As described above, FIGS. 15(b1)-(b4) show a BT of the negative photoresist on top of a pre-patterned substrate. The transferred photoresist layer sticks to the top of the photoresist pattern array and is subsequently patterned through the standard photolithography. If repeated, multilayer polymeric structures can be fabricated. FIGS. 15(c1)-(c4) depict the photoresist BT transfer to pre-etched substrates, and the photoresist film is bridging over the etched trench in Si. Once transferred and photolithographically patterned, the photoresist layer on the gap becomes cantilevers and free-standing strings. Finally, the photoresist BT process entails very small lamination (or rolling) pressure, facilitating the transfer to fragile substrates such as a thin ceramic porous membrane, as shown in FIGS. 15(d1)-(d4).

Figure 16:
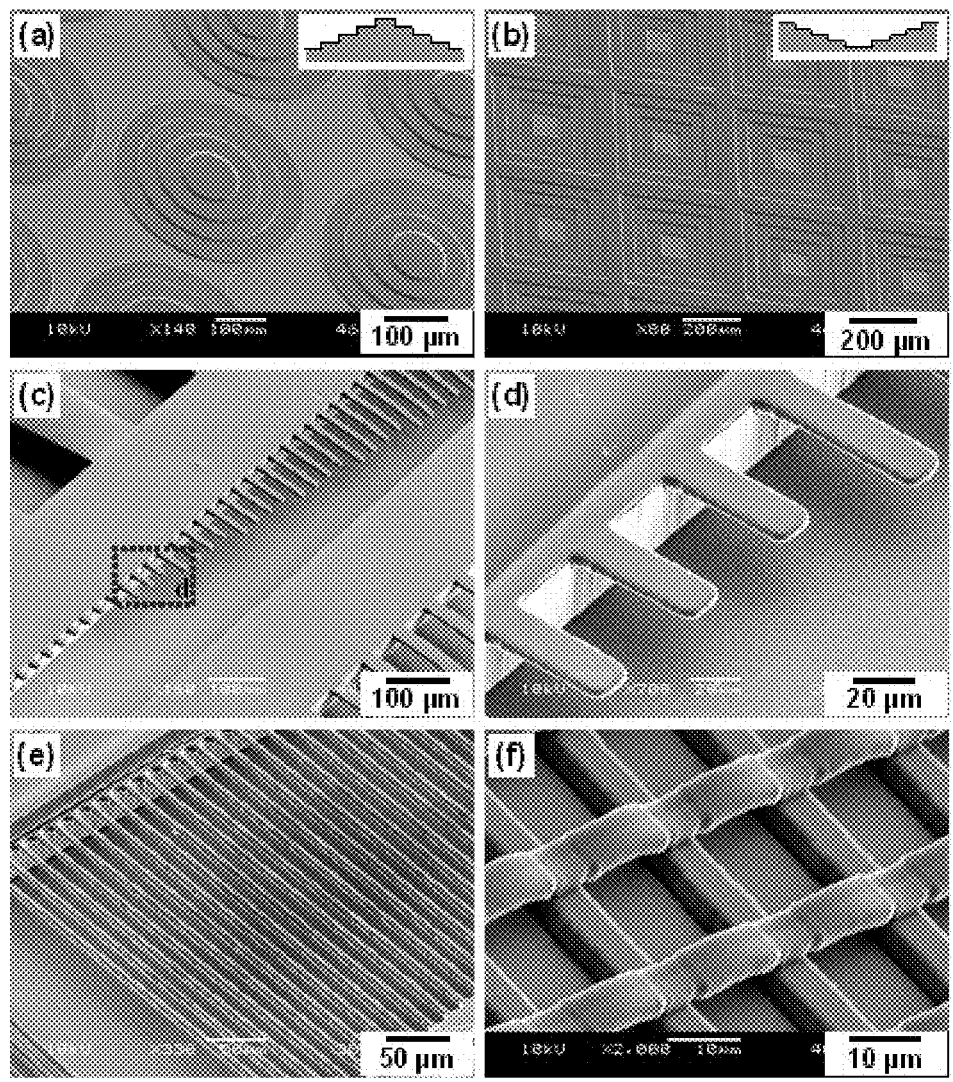
FIG. 16 shows SEM images of (a-b) exemplary multilayer polymeric structures and (c-f) exemplary free-standing polymeric structures.

Examples of the multilayer polymeric and free-standing structures are shown in SEM images in FIGS. 16(a)-16(f). The negative photoresist, AZ N6020 (thickness of 2 to 8 μm) is used to fabricate these structures. As seen in FIGS. 16(e)-16

Figure 17:
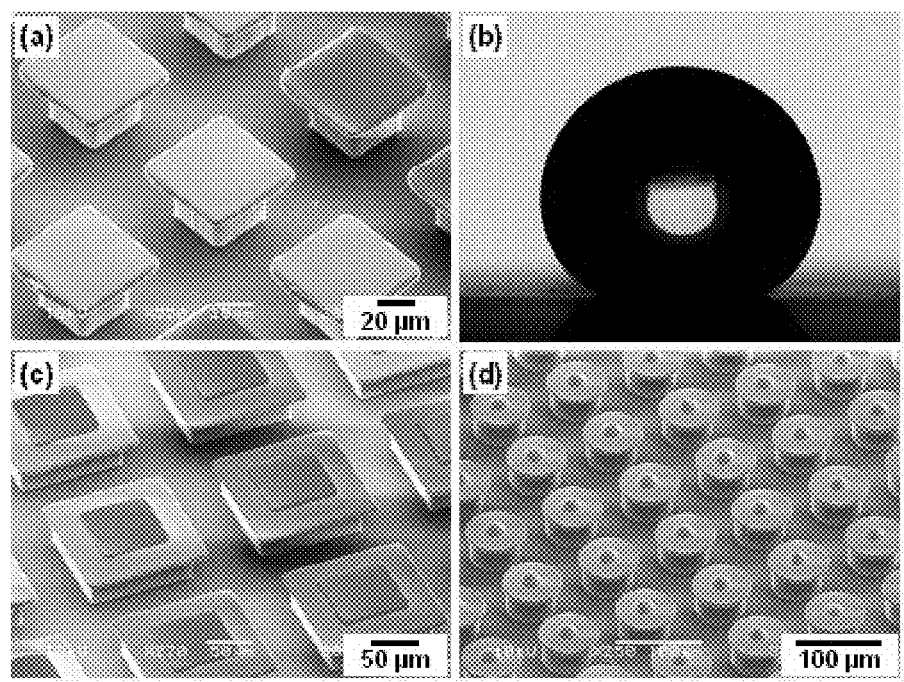
FIG. 17 shows (a) an SEM image of exemplary re-entrant structures, (b) superhydrophobic nature (contact angle of 163°) of the re-entrant structures, and (c-d) exemplary multilayer re-entrant structures.

(f), the free-standing features have finer resolution compared to the dry film photoresist method because a thinner film can be prepared. Various single or multilayer re-entrant features are shown in FIG. 17. These hoodoo-like structures are also difficult to be fabricated in a one-step process, and one of the potential applications includes the creation of geometry-induced superhydrophobicity [Tutuje Science 2007]. A water droplet contact angle of 167° is measured for one of the hoodoo-like arrays in FIG. 17(a).

Figure 18:
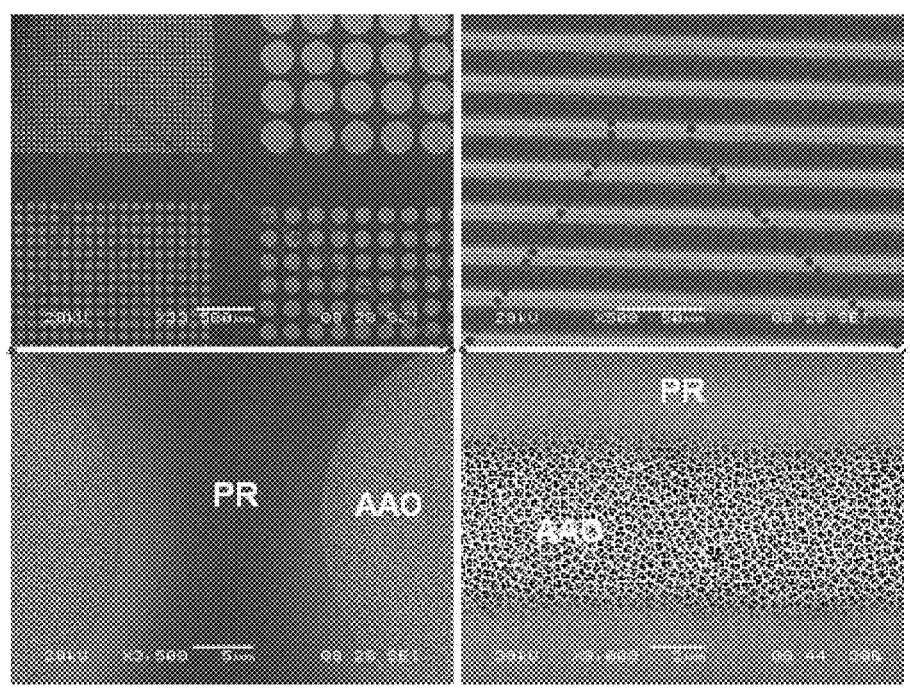
FIG. 18 shows a patterned photoresist film on a porous alumina membrane.

A porous alumina membrane, which is extremely fragile and delicate, can be patterned via BT photoresist as shown in FIG. 18. The alumina surface has inherently a low surface energy and makes the photoresist transfer challenging. Surface modification to increase surface energy of the alumina membrane can be performed, including a short deposition of metal (e.g. Cr) film. Once the photoresist is transferred, the film is patterned using photolithography. A number of different feature sizes and shapes are patterned on the 220 nm porous alumina, and the openness of the pores is prevalent in the SEM image in FIG. 18. A liquid flux measurement is also carried out to confirm that the pores remain open through-thickness. The patterning of this kind of fragile surface has not previously been demonstrated, and the application of photoresist via spinning or spraying would easily block the pores.

Multilevel Etching of Silicon Molds

Referring again to FIG. 1(d), after removing the second portion of the photoresist layer from the mold (first substrate) by peeling away the elastomeric stamp, the first portion of the photoresist layer that remains on the protrusions of the mold can be utilized for creating multilevel structures that are difficult to be fabricated otherwise.

Figures 6A, 6B, 6C, 6D, 6E:
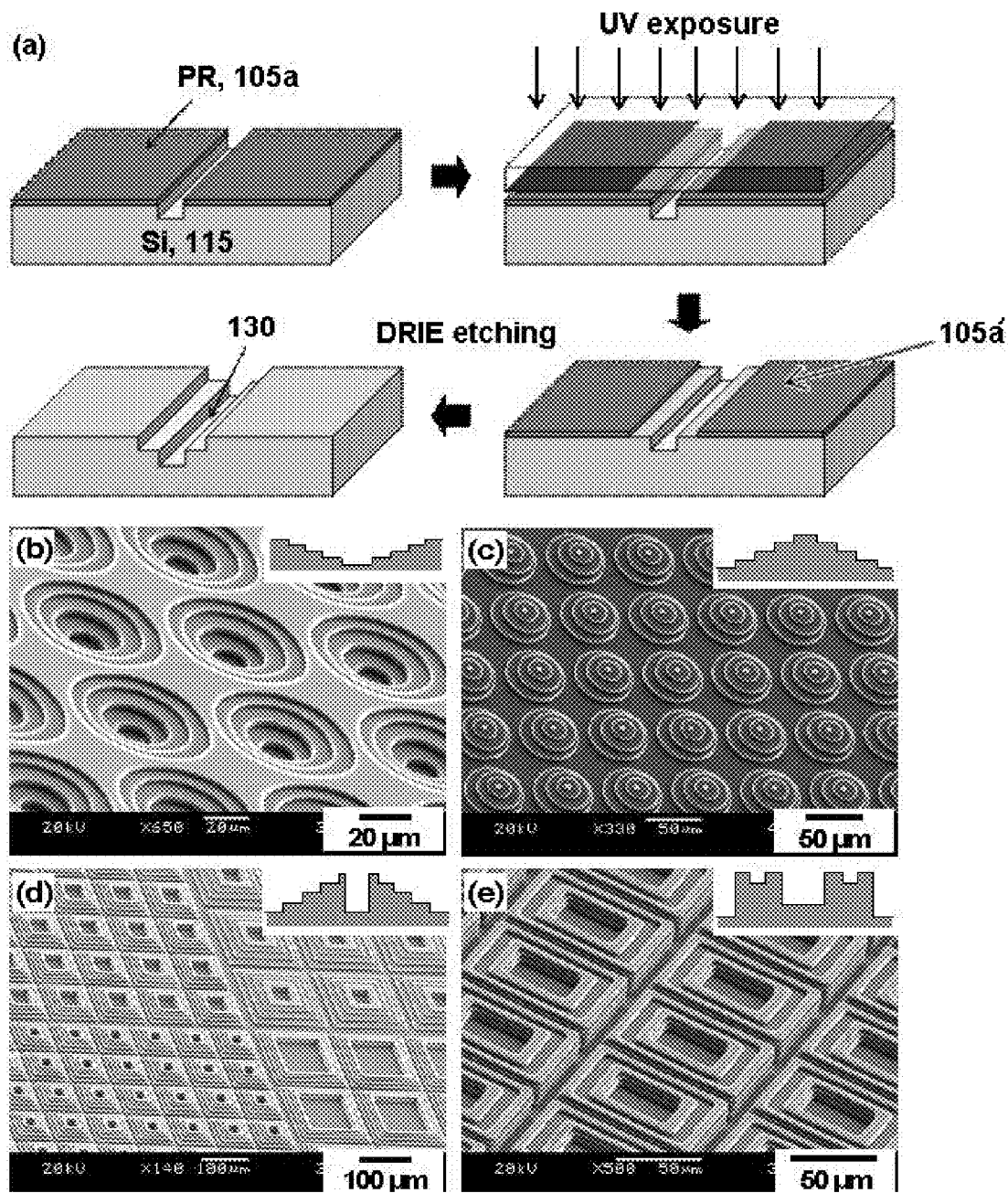
FIG. 6(a) depicts a procedure for etching multilevel structures on silicon, where the photoresist films (AZ 1528) transferred onto the Si mold can be further patterned and serve as an etch mask.
FIGS. 6(b)-6(e) show SEM images of various 4-level structures that have different cross-sectional profiles, as shown in each inset.

Since the photoresist films remain photochemically active after detachment, the films may be further modified by standard photolithography. The main challenge associated with patterning the high-aspect-ratio-etched substrates is that, whether spin-coated or spray-coated, photoresist in the trenches tends to be thicker due to the larger surface tension and the resulting film is more susceptible to streaks, pinholes, and unwanted edge beads, which undermine the subsequent exposure and development processes. Shadow mask (or stencil) techniques are frequently used to deposit and/or etch patterns on the pre-etched surfaces, but lack an ability to form a conformal contact to the target substrates, degenerating the fidelity of the pattern transfer. Soft lithography-based shadow masks using elastomeric membranes can mitigate this limitation, and have been utilized as dry resists for RIE etching. However, the membrane mask is mechanically unstable, has restrictions in terms of the types of the features that can be realized, and is difficult to be aligned to existing features. FIG. 6(a) depicts a process to construct the multilevel structure of a Si mold 115 by patterning the transferred photoresist layers 105a and subsequent DIRE etching. The photoresist layer 105a "inked" on the protruded surfaces 115a of the mold 115 has a uniform thickness and can be exposed in a standard exposure tool with pattern registration. Positive-tone photoresist AZ 1518 is used due to its resistance to $SF_6$ plasma. After detachment from the stamp, the transferred photoresist films 105a on the Si mold 115 are cured at 110° C. for 2 min and exposed with a dose of 160 mJ cm$^{-2}$ in a H-line (405 nm) mask aligner. Development is done in a diluted bath of Clariant 400K developer (potassium hydroxide). The resulting photoresist films 105a' are hard-baked at 135° C. for 5 min prior to ICP-DRIE etching to form multilevel structures 130 in the silicon mold 115.

Arrays of multilevel (4 levels) structures with various cross-sections can be created over a 4 by 4 cm$^2$ area with a defect density of less than 1%. Corresponding scanning electron microscope (SEM) images are shown in FIGS. 6(b)-6(e). These types of 3-D structures can potentially be used as platforms of myriad applications including 3-D mold fabrication, optical elements, MEMS sensors and actuators, and microfluidic devices.

Working Mechanism of the Detachment Lithography Process

A phenomenological model is set forth here to provide detachment criteria for polymers and the dependence of the minimum pattern size on the film thickness and pattern density. In order to understand the working principle of detachment lithography, consider having a stamp subjected to a peel force F normal to the stamp/mold interface, where the stamp is peeled in the direction parallel to the edges of the line patterns on the mold (FIG. 7(a)). Fracturing the film along the edges of the protruding features of the mold is governed by three different interfacial energies: the fracture energy (or energy release rate) per unit crack area required to separate the stamp and film ($G_{stamp-film}$), the fracture energy per unit area between the film and mold ($G_{film-mold}$), and the fracture energy associated with tearing the film itself ($G_{film-film}$). Two criteria for successful detachment have been proposed: i) the adhesion strength between the stamp and the film must be greater than that between the film and mold for selective transfer, and ii) the difference in the adhesion strength of two interfaces should exceed the cohesion strength of the film. The adhesion and cohesion strengths in previous studies were related to the thermodynamic work of adhesion ($W_a$) that was calculated from contact angle measurements of some probe liquids. The inventors have found in photoresist detachment lithography that the actual force involved in peeling or tearing is orders of magnitudes larger than the values predicted from $W_a$ because of the irreversible energy dissipated at the surface and in the bulk of materials. The actual force is believed to be a function of the interfacial geometry, peering velocity, and temperature.

Figures 7A, 7B, 7C, 7D, 7E, 7F:
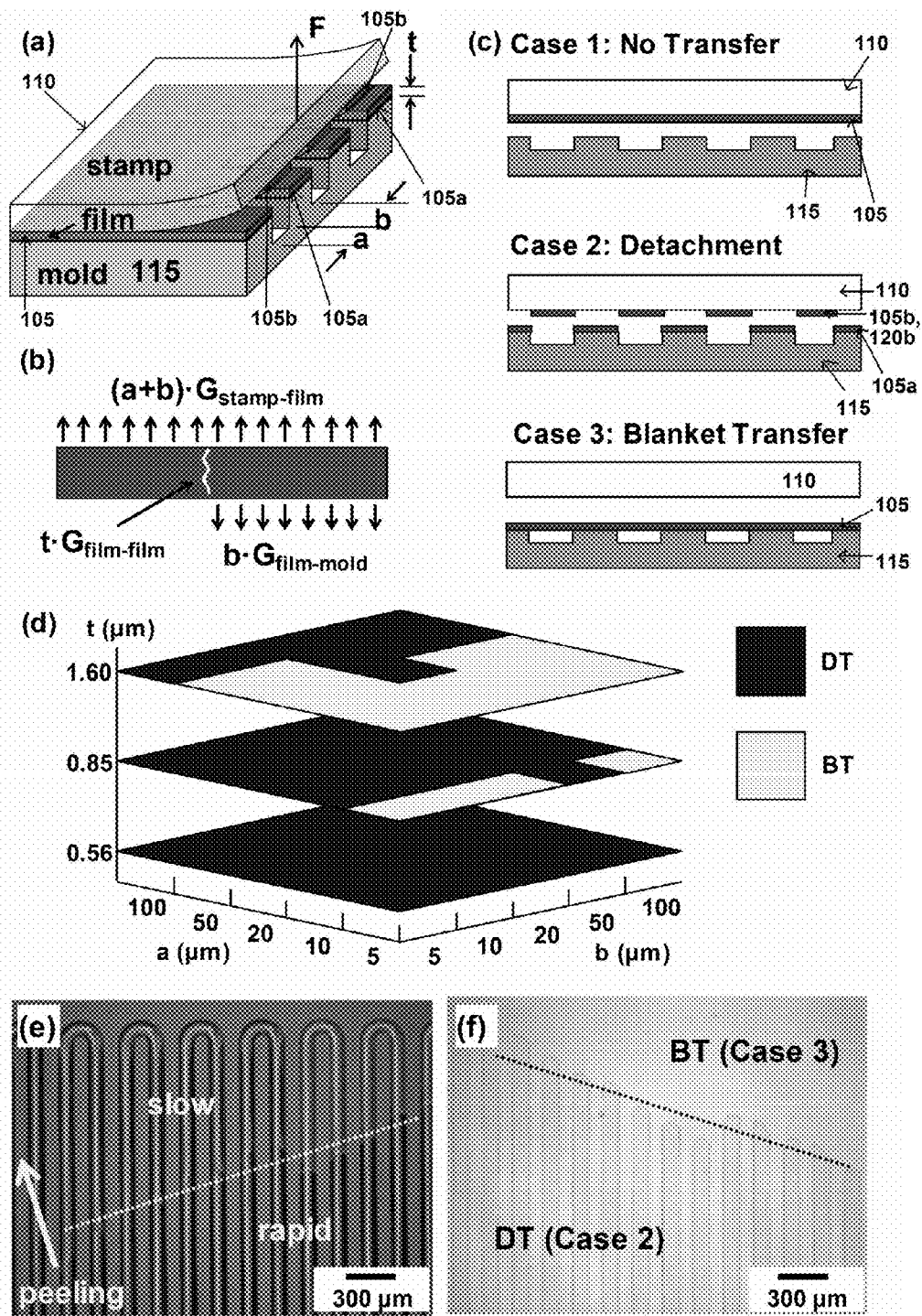
FIG. 7(a) is a schematic showing the geometrical dependence of detachment lithography.
FIG. 7(b) is a force balance diagram of a film segment.
FIG. 7(c) shows three possible scenarios after peeling the stamp from the mold: (1) film remains on the stamp without any transfer to the mold, (2) film is detached and patterned via detachment lithography, and (3) entire film is transferred to the mold.
FIG. 7(d) shows the dependence of detachment lithography on the pattern geometry (a, separation and b, width) and film thickness (t) of photoresist S1805.
FIG. 7(e) depicts how, after photoresist AZ1518 on the stamp is brought into a contact with the Si mold, the stamp is peeled away from the bottom right to the top left, and a transition from DT to BT can be observed as the peeling speed is slowed down and the interfacial adhesion between the stamp and the film becomes lower.
FIG. 7(f) is a mirror image of the photoresist patterns on the PDMS stamp.

The geometrical dependence on detachment lithography can be established by minimizing the total peel force exerted on the unit film segment at the crack propagation plane for a Si mold with N number of the repeating line patterns of width b and spacing a (FIG. 7(b)). The peel force is typically independent of contact area because the plane stress is concentrated at the crack tip. Also note that the peel force scales with the film contact width, while the force needed for tearing scales with the film thickness. Three scenarios of potential outcomes after peeling are shown in FIG. 7(c), and the total peel force of the unit film segment (F/N) corresponding to each scenario can be written as:

$$\frac{F}{N} = \begin{cases} b \cdot G_{film\text{-}mold} & \text{CASE 1: No Transfer}(NT) \\ b \cdot G_{stamp\text{-}film} + \\ t \cdot G_{film\text{-}film} & \text{CASE 2: Detachment Transfer}(DT) \\ (a+b) \cdot G_{stamp\text{-}film} & \text{CASE 3: Blanket Transfer}(BT) \end{cases} \quad (1)$$

The process requiring the least peel force is the one most likely to occur. Exact modeling or measurement of each C is beyond the scope of the text, but a qualitative description can be made. Generally, G includes two factors, with $G=G_0[1+f(v,T)]$ where $G_0$ is a critical fracture energy below which no fracture occurs, and $[1+f(v,T)]$ represents an amount of energy expended in irreversible processes, which is a function of the peel velocity v and temperature T. While this energy loss term is close to a unity for the interfaces of most elastic materials (i.e., $G_{film\text{-}mold}$ or $G_{film\text{-}film}$), it rapidly increases with increasing v or decreasing T for the interfaces of viscoelastic materials such as PDMS (i.e., $G_{stamp-film}$). Therefore, rapid peeling at reduced temperatures effectively increases $G_{stamp-film}$, without significantly influencing other terms, making a value associated with Case 2 smaller than that of Case 3; thus, detachment transfer (DT) is favored.

The experiments carried out by the inventors confirm that the minimum pattern size achieved by detachment lithography depends on the film thickness and the pattern density of the mold. The silicon mold includes arrays of lines of various widths (b=5, 10, 20, 50, 100 μm) and separations (a=5, 10, 20, 50, 100 μm). FIG. 7(d) shows that, despite the same peeling condition (fixed v and T), two different outcomes (either DT or BT) result for different thicknesses of the film and mold pattern. For t=0.56 μm, only DT takes place, but as the film grows thicker (thus making a value of Case 2 larger), blanket transfer (BT) starts to occur for small a and b. When the peeling velocity is reduced during peeling across the same pattern geometry, the transition of DT to BT is observed, manifesting the kinetic effect of the adhesion (see FIG. 7(e)-7(f)).

It is important to note, however, that the critical fracture energy, $G_0$, is strongly dependent on $W_a$, linking the interfacial chemical bonds (e.g. VdW) to the mechanical strength. It is well known that a small difference in $W_a$ can cause a large change in $G_o$. $W_a$ is calculated using contact angle measurements for the PDMS stamp/photoresist film and photoresist film/SiO$_2$ mold interfaces: $W_{PDMS-photoresist}$=57.9 mJ m$^{-2}$ and $W_{photoresist-SiO2}$ 65.2 mJ m$^{-2}$. Though $W_{photoresist-SiO2}$ is only 7.3 mJ m$^{-2}$ larger than $W_{PDMS-photoresist}$, the no transfer (NT) process (Case 1) is never observed for any peeling conditions and interfacial geometry, implying that $G_{photoresist-SiO2}$ is much larger than $G_{PDMS-photoresist}$. When the mold surface is coated with a monolayer of 1H, 1H, 2H, 2H-perfluorodecyltrichlorosilane (FDTS), which essentially reduces the surface energy and thus $W_{photoresist-FDTS}$ (=44.3 mJ m$^{-2}$), $G_{Photoresist-FDTS}$ becomes low enough that only NT takes place for all peeling conditions.

The process described here has various unique features and benefits. For example, the use of a flat elastomeric stamp and a rigid mold makes possible more accurate pattern transfer, easier cleaning of the stamp, and mechanical durability of each member. Also, the viscoelastic nature of elastomeric (e.g., PDMS) stamps permits adhesion to be kinetically switched to enhance pick-up and ease printing, where the peeling velocity and surrounding temperature can be adjusted to help increase the yield of the process. In addition, photoresist patterns can be created on curved and three-dimensional substrates that can be used as an etching or liftoff mask. It is difficult with conventional machining tools to machine small features on the surface of a stainless steel substrate having a three-dimensional (3D) shape. With the technique described here, however, it is possible to transfer photoresist patterns to the surface of such 3D substrates and use them as masks for subsequent etching processes.

Supplementary Examples

Figures 8A, 8B, 8C, 8D:
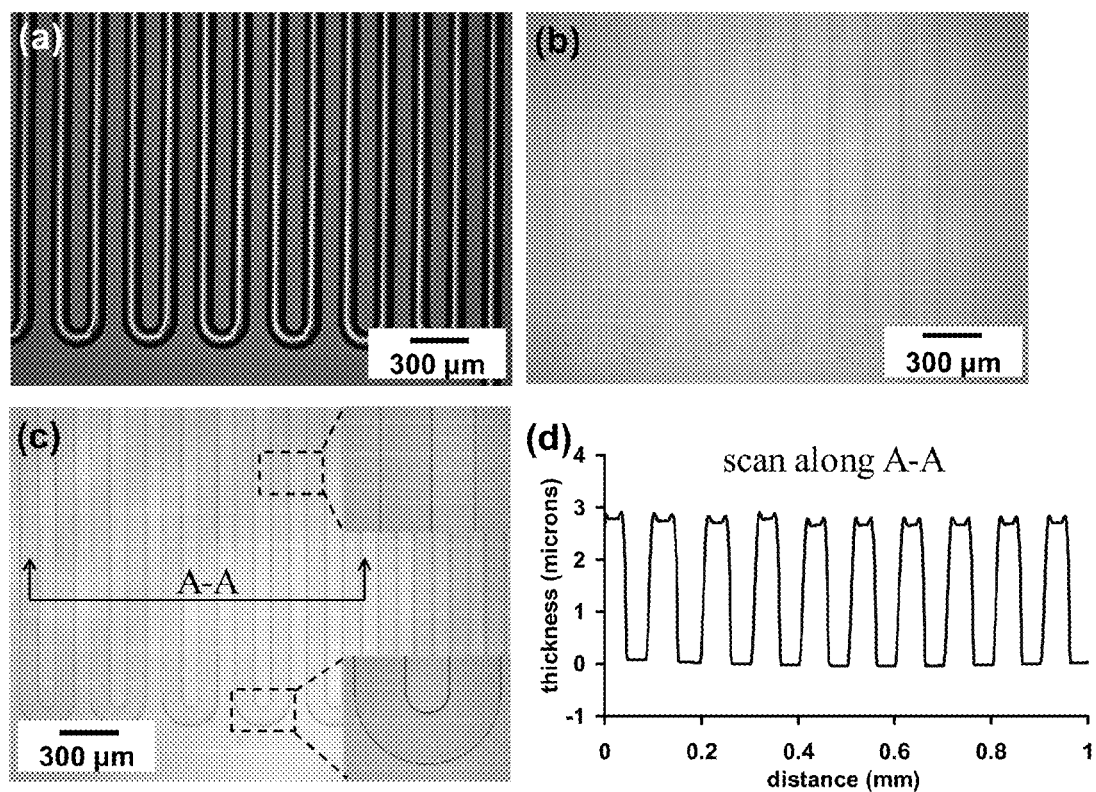
FIGS. 8(a) and 8(b) are optical micrograph images of an exemplary stamp and mold after detachment lithography; the pattern on the mold is transferred to a glass slide, as shown in the optical micrograph of FIG. 8(c); surface profilometry confirms the thickness in FIG. 8(d)

Optical micrograph images of each step in detachment lithography are shown in FIGS. 8(a)-8(c). A 2.7 μm thick PR1518 (dark brown) was transferred on the protruded parts of a Si mold that had 100 μm wide and 100 μm spaced serpentine trenches (FIG. 8(a)), and the portions of the photoresist film that did not make contact to the Si mold stay on the PDMS surface (FIG. 8(b)) and was later transferred to a flat glass microscope slide (FIG. 8(c)). No residual photoresist was found on the stamp in the regions where the photoresist was detached by the mold. The photoresist patterns on the glass slide exhibit the reversed (or negative) image of the Si mold. The sharp edges, as shown in the insets of FIG. 8(c), suggest that the mechanical fracture of the film occurred in a controlled manner along the edge of the mold. The contact-mode surface profilometry confirms the uniformity of the photoresist thickness across the entire patterned region (FIG. 8(d)).

Figure 9A:
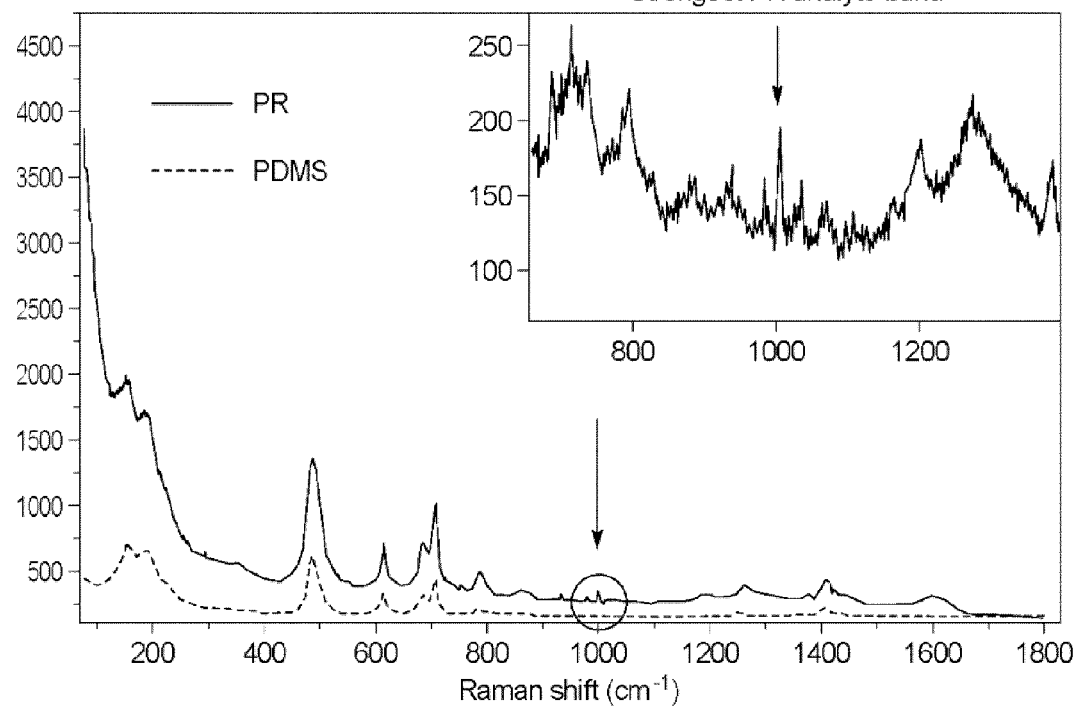
FIGS. 9(a) and 9(b) show Raman data of the surface of the stamp after detachment.
Figure 9B:
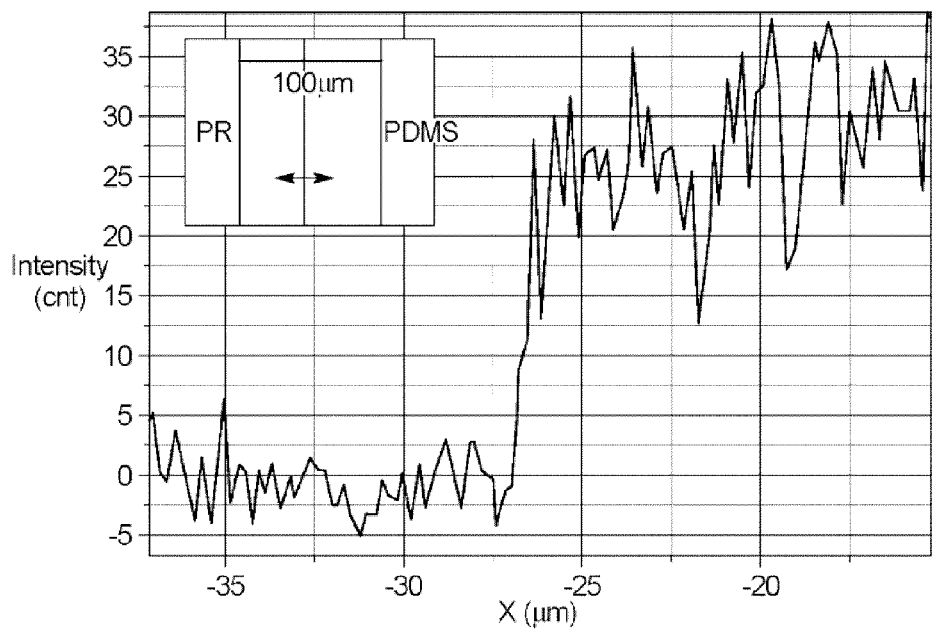

Raman spectroscopy (LabRAM Aramis, Horiba Jobin Yvon) was employed to inspect the level of the residual photoresists on the PDMS surface after detachment. FIG. 9(a) shows the Raman spectra for the cleaned PDMS (green) and spin-coated photoresist layer (blue) on the PDMS as references. Comparison of two spectra indicates the strongest photoresist analyte band at 1000 cm$^{-1}$. The line map across the photoresist step (FIG. 9(b)) on the PDMS surface was generated from collecting the Raman spectra at each pixel (0.2 μm/pixel) and shows little photoresist residues in the detached region.

Calculation of the Work of Adhesion

For low surface energy systems such as water, organic liquids, and polymers, the work of adhesion at two solid interfaces ($W_{12}$) can be calculated with a harmonic-mean equation [Wu 1974].

$$W_{12} = \frac{4\gamma_1^d \gamma_2^d}{\gamma_1^d + \gamma_2^d} + \frac{4\gamma_1^p \gamma_2^p}{\gamma_1^p + \gamma_2^p}, \qquad (1)$$

where γ is the surface tension and d and p denote the dispersion and polar components of surfaces 1 and 2 of solid materials. Each surface tension component can be quantified by contact angle measurements through the following equation $$\gamma_l(1+\cos\theta) = 2\sqrt{\gamma_s^d \gamma_l^d} + 2\sqrt{\gamma_s^p \gamma_l^p}. \qquad (2)$$

Since $\gamma_l^d$ and $\gamma_l^p$ are known for the test liquids, independent contact angle measurements using two test liquids would generate a system of linear equations for unknowns $\gamma_s^d$ and $\gamma_s^p$. Water and ethylene glycol were chosen as a test pair ($\gamma_{H_2O}^d$=23.9, $\gamma_{H_2O}^p$=48.8, $\gamma_{EG}^d$=29.2, and $\gamma_{EG}^p$=18.3 mJ m$^{-2}$). [Wang JACS 2002] Their contact angles on SiO$_2$, PDMS, PR S1805, and FDTS-treated mold surfaces were measured using a goniometer (KSV Instruments, CAM 200) and summarized in Table 1.

TABLE 1

Contact angles of various solid surfaces for two probe liquids (water and ethylene glycol)

|  | H$_2$O (°) | Ethylene Glycol (°) |
|---|---|---|
| SiO$_2$ | 62.1 | 30.4 |
| PDMS | 99.7 | 75.8 |
| PR S1805 | 83.5 | 47.3 |
| FDTS-treated | 108.6 | 88.7 |

The solid surface energy components of each surface were then calculated and are summarized in Table 2.

TABLE 2

Solid surface energy components (dispersed and polar) of $SiO_2$, PDMS, PR S1805, and FDTS-treated $SiO_2$ surface.

| | $\gamma_s$ (mJ m$^{-2}$) | $\gamma_s^d$ (mJ m$^{-2}$) | $\gamma_s^p$ (mJ m$^{-2}$) |
|---|---|---|---|
| $SiO_2$ | 41.3 | 23.0 | 18.3 |
| PDMS | 22.3 | 21.1 | 1.2 |
| PR S1805 | 41.1 | 39.1 | 2.0 |
| FDTS-treated | 15.1 | 14.3 | 0.8 |

The work of adhesion between the photoresist film and the mold surface and between the photoresist film and the stamp may be estimated using equation (1) and data in Table S2. The results are:
$W_{PDMS-PR}$=57.9 mJ m$^{-2}$
$W_{PR-SiO2}$=65.2 mJ m$^{-2}$
$W_{PR-FDTS}$=44.3 mJ m$^{-2}$ The inventors believe the technology described herein may enable solutions to fabricate microstructures that are difficult to be made otherwise. Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of forming a patterned layer of a material on a substrate, the method comprising:
    forming a layer of a material on a stamp;
    contacting the stamp with a first substrate comprising a pattern of protruding and recessed features to bring a first portion of the layer into conformal contact with the protruding features;
    removing the stamp from the first substrate, the first portion of the layer remaining in conformal contact with the protruding features and a second portion of the layer opposite the recessed features being removed with the stamp, thereby forming a patterned layer on the stamp inverse to the pattern on the first substrate;
    transferring at least a portion of the patterned layer on the stamp to a second substrate heated to a temperature ranging from about 40° C. to about 110° C.

2. The method of claim 1, wherein removing the stamp comprises peeling the stamp from the first substrate, the stamp being a compliant stamp.

3. The method of claim 1, wherein removing the stamp comprises peeling the first substrate from the stamp, the first substrate being a compliant first substrate.

4. The method of claim 1, wherein transferring at least the portion of the patterned layer to the second substrate comprises contacting the patterned layer with the second substrate and causing relative motion between the stamp and the second substrate at a transfer rate of from about 0.01 cm/s to about 1 cm/s.

5. The method of claim 4, wherein causing relative motion between the stamp and the second substrate comprises peeling the stamp from the second substrate.

6. The method of claim 4, wherein causing relative motion between the stamp and the second substrate comprises moving the second substrate over the stamp.

7. The method of claim 1, wherein the second substrate comprises a curved surface.

8. The method of claim 1, wherein the removal of the stamp from the first substrate is carried out at a removal rate ranging from about 0.1 cm/s to about 50 cm/s.

9. The method of claim 1, further comprising, after removing the stamp from the first substrate:
    patterning the first portion of the layer in conformal contact with the protruding features to form an etch mask on the first substrate; and
    creating multilevel features in the first substrate.

10. The method of claim 1, wherein the stamp is contacted with the first substrate in a vacuum environment.

11. The method of claim 1, further comprising heating the first substrate during the contacting of the stamp with the first substrate.

12. The method of claim 11, wherein the first substrate is heated at a temperature in the range of from about 40° C. to about 110° C.

13. The method of claim 1, further comprising, prior to removing the stamp from the first substrate, cooling the first substrate.

14. The method of claim 13, wherein the first substrate is cooled to a temperature in the range of from about about −4° C. to about 60° C.

15. The method of claim 1, wherein the pattern of protruding and recessed features comprises an array of substantially parallel linear features and the removing of the stamp comprises peeling the stamp in a direction nonparallel to the linear features.

16. The method of claim 15, wherein the direction of the peeling is substantially perpendicular to the linear features.

17. The method of claim 1, further comprising, prior to contacting the stamp with the first substrate, increasing the hydrophilicity of the first substrate.

18. The method of claim 17, wherein increasing the hydrophilicity of the first substrate comprises exposing the first substrate to one of an oxygen plasma and piranha solution.

19. The method of claim 1, wherein the protruding and recessed features have a spacing of from about 3 microns to about 1,000 microns.

20. The method of claim 1, wherein the protruding and recessed features have a feature size of from about 3 microns to about 1,000 microns in at least one lateral dimension.

21. The method of claim 1, wherein the layer comprises a thickness of at least about 100 nm.

22. The method of claim 1, wherein the stamp comprises a thickness of at least about 0.1 mm.

23. The method of claim 1, wherein the material comprises a functional polymer.

24. The method of claim 23, wherein the functional polymer is selected from the group consisting of a photoresist, an epoxy, and an adhesive.

25. A method of forming a structure on a substrate, the method comprising:
    forming a first layer comprising a photosensitive polymer on a stamp;
    contacting the stamp with a substrate comprising a pattern of protruding and recessed features, thereby bringing a portion of the first layer into conformal contact with the protruding features of the substrate, the first layer not coming into conformal contact with the recessed features;
    transferring an entirety of the first layer to the substrate, the stamp being removed from the substrate; and removing material from the first layer, thereby forming a first patterned layer comprising the photosensitive polymer on the pattern of protruding and recessed features.

26. The method of claim 25, wherein at least a portion of the first patterned layer overlies one or more of the protruding features of the substrate, thereby creating one or more multi-layered structures.

27. The method of claim 25, wherein at least a portion of the first patterned layer overlies one or more of the recessed features of the substrate, thereby creating one or more partially unsupported structures.

28. The method of claim 25, wherein the recessed features of the substrate comprise pores and the protruding features of the substrate comprise material surrounding the pores, the substrate being a porous substrate.

29. The method of claim 25, wherein removing material from the first layer comprises photolithographically patterning the first layer.

30. A method of forming a patterned layer of a material on a substrate, the method comprising:
forming a layer of a material on a stamp;
contacting the stamp with a first substrate comprising a pattern of protruding and recessed features to bring a first portion of the layer into conformal contact with the protruding features;
removing the stamp from the first substrate, the first portion of the layer remaining in conformal contact with the protruding features and a second portion of the layer opposite the recessed features being removed with the stamp, thereby forming a patterned layer on the stamp inverse to the pattern on the first substrate;
transferring at least a portion of the patterned layer on the stamp to a second substrate, wherein the second substrate comprises a pattern of protruding and recessed features, and wherein transferring at least the portion of the patterned layer on the stamp to the second substrate comprises:
contacting the stamp with the second substrate to bring a first portion of the patterned layer into conformal contact with the protruding features of the second substrate; and
removing the stamp from the second substrate, the first portion of the patterned layer remaining in conformal contact with the protruding features and a second portion of the patterned layer opposite the recessed features being removed with the stamp.

31. A method of forming a patterned layer of a material on a substrate, the method comprising:
forming a layer of a material on a stamp;
contacting the stamp with a first substrate comprising a pattern of protruding and recessed features to bring a first portion of the layer into conformal contact with the protruding features;
removing the stamp from the first substrate, the first portion of the layer remaining in conformal contact with the protruding features and a second portion of the layer opposite the recessed features being removed with the stamp, thereby forming a patterned layer on the stamp inverse to the pattern on the first substrate;
transferring at least a portion of the patterned layer on the stamp to a second substrate;
after the transferring, contacting the portion of the patterned layer with a cover layer, thereby sandwiching the patterned layer between the cover layer and the second substrate, and
processing the patterned layer to bond the cover layer to the second substrate and create channels on the second substrate having walls defined by the portion of the patterned layer.

\* \* \* \* \*